(12) United States Patent
Morin

(10) Patent No.: US 7,493,606 B2
(45) Date of Patent: Feb. 17, 2009

(54) METHOD FOR COMPILING AND EXECUTING A PARALLEL PROGRAM

(75) Inventor: Luc Morin, Canton-Tremblay (CA)

(73) Assignee: Université du Québec à Chicoutimi (UQAC), Chicoutimi, QC (CA)

( * ) Notice: Subject to any disclaimer, the term of this patent is extended or adjusted under 35 U.S.C. 154(b) by 665 days.

(21) Appl. No.: 10/909,756

(22) Filed: Aug. 3, 2004

(65) Prior Publication Data
US 2006/0031814 A1      Feb. 9, 2006

(51) Int. Cl.
*G06F 9/44* (2006.01)
(52) U.S. Cl. .................. 717/149; 717/135; 717/150; 703/14
(58) Field of Classification Search ................ None
See application file for complete search history.

(56) References Cited

U.S. PATENT DOCUMENTS

| 2003/0154466 | A1  | 8/2003 | Snider |
| 2004/0044514 | A1* | 3/2004 | Granny et al. ............ 703/23 |

FOREIGN PATENT DOCUMENTS

| EP | 0 437 491 B1 | 12/1995 |
| WO | WO 02/13004  | 2/2002  |

OTHER PUBLICATIONS

Verbauwhede et al., "The Happy Marriage of Architecture and Application in Next-Generation Reconfigurable Systems", Apr. 14, 2004, ACM, pp. 363-376.*
Salcic et al., "REFLIX: a processor core with native support for control-dominated embedded applications", Aug. 11, 2003, Elsevier, pp. 13-25.*

* cited by examiner

*Primary Examiner*—Tuan Q. Dam
*Assistant Examiner*—Ben C Wang
(74) *Attorney, Agent, or Firm*—Ogilvy Renault, LLP

(57) ABSTRACT

A method for multi-platform parallel or real-time machine programming is provided. The method comprises specifying a parallel machine definition code defining a plurality of signal or data processing components and a communication of data or signals between the components, automatically converting the code into computer instructions for execution on an essentially sequential, non-parallel computer processor, a parallel execution of the instructions on the sequential processor and automatically converting the code into hardware programming data for providing parallel hardware operation according to the code, by including, in the hardware programming data, event control circuitry specification, priority control circuitry specification and buffering control circuitry specification to ensure that the hardware operation matches the execution on the sequential computer processor. The parallel machine code is implemented using the hardware programming data on a parallel hardware machine having parallel processing capability and using the computer instructions on the sequential processor in a manner that is essentially exchangeable.

20 Claims, 11 Drawing Sheets

METHOD FOR COMPILING AND EXECUTING A PARALLEL PROGRAM

REFERENCE REGARDING A COMPUTER PROGRAM LISTING APPENDIX

This application includes computer program listing appendix submitted on a compact disk which is hereby incorporated by reference. The computer program listing includes the following files:

| C Code directory |  |  |
|---|---|---|
| FIG. 2 - Flattened tree data structure | | |
| basic.h | Jun. 7, 2004 | 10.7 KB |
| cir.h | Jun. 7, 2004 | 20.7 KB |
| fct.h | Jun. 7, 2004 | 2.36 KB |
| FIG. 3 - Compiled code interface | | |
| genc_def.h | Jun. 10, 2004 | 1.61 KB |
| genc_fct.c | Jun. 8, 2004 | 22.6 KB |
| genc_fct.h | Jun. 8, 2004 | 4.06 KB |
| genc_macro.h | Jun. 8, 2004 | 2.66 KB |
| genc_rvm.h | Jun. 10, 2004 | 9.04 KB |
| FIG. 3 - Virtual machine data structure | | |
| struc.h | Jun. 7, 2004 | 22.5 KB |
| FIG. 4 - Event manager interface | | |
| event.h | Mar. 29, 2004 | 4.19 KB |
| FIG. 4 - Virtual machine main loop | | |
| boucle.c | Mar. 30, 2004 | 5.24 KB |
| VHDL code directory | | |
| ctype.vhd | Mar. 2, 2004 | 5.09 KB |
| packageConv.vhd | Jun. 17, 2004 | 23.3 KB |
| RodinStd.vhd | Jun. 8, 2004 | 6.58 KB |

Portions of this disclosure contain material which is subject to copyright protection. The copyright owner has no objection to the facsimile reproduction by anyone of the patent document or disclosure, as it appears in the Patent and Trademark Office patent file or records, but reserves all other copyright rights.

FIELD OF THE INVENTION

The invention relates to a method for compiling and executing parallel programs. More specifically, it relates to defining and compiling programs that can be executed in a parallel fashion on both sequential and programmable hardware machine to produce the same results.

BACKGROUND OF THE INVENTION

Field Programmable Gate Array technology is becoming more and more pervasive due to technology advancements that allow for very fast programmable hardware devices to be mass-produced at a low cost. The integration of programmable hardware and traditional sequential processors for serving a same application is also commonly found, as it is advantageous to be able to alternatively execute code sequentially or in parallel depending on the set of instructions. When defining code that could potentially run on sequential-type and parallel-type machines there arises a problem of compatibility. The problem is that most programming languages are sequential and it is necessary that hardware implementation be highly parallel. It is possible for some compilers to create a parallel structure from a sequential program definition. Although it is possible to translate a sequential program for parallel execution, it is a very complex task since sequential algorithms do not map easily onto parallel machines.

Alternatively, since HDL (Hardware Description Language) are parallel languages, they could be used to program parallel algorithms. There are good VHDL simulators that can be used to predict accurately the results. The drawback is that VHDL programming currently requires a high level of knowledge and experience.

Furthermore, special languages, mixing parallel and sequential abstractions, have been used. The execution of the resulting programs on sequential machines is more of a simulation, and the translation of such programs for parallel hardware leads to complex results often limited to a specific class of problems. There exist a need for structures that can be easily mapped onto parallel hardware and that would efficiently execute without changes on sequential machines.

There exists therefore a need for a user-friendly programming environment, single or multi-threaded, that would be flexible and unrestricted at the same time.

Therefore, there exists a need for a method of programming that is portable and can be implemented on sequential processors and on FPGAs.

SUMMARY OF THE INVENTION

According to a broad aspect, there is provided a method of executing machine program code using an essentially sequential, non-parallel computer processor to provide a faithful facsimile of hardware signal or data processing having parallel processing capability, the code defining a plurality of components, each one of the components performing at least one signal or data operation, each one of the components receiving at least one signal or data value input and providing at least one signal or data value output. Processing steps are defined, wherein each one of the operations may only be performed once during each of the processing steps. An associated event value is defined for some of the outputs. For each one of the components having event values associated with a plurality of signal or data value inputs, an indication of priority associated with each one of the inputs is defined. The event value is set when the associated output signal or data value changes in a current one of the processing steps, and the event value is reset when the associated output signal or data value does not change in the current one of the processing steps, the event value being set or reset at an end of the current one of the processing steps. The operations are selectively performed during each of the processing steps when at least one of the event values is set for the input signals or data values specific to the operations, wherein the operations are performed in accordance with the priority. The signal or data value outputs are buffered so as to prevent changes to them from being read by the inputs within a same one of the processing steps, and the buffered outputs are copied at an end of each one of the processing steps so as to allow them to be read by the inputs in a next one of the processing steps.

According to another broad aspect, there is provided a method of multi-platform machine programming. The method comprises: specifying a machine definition code defining a plurality of signal or data processing components, each component performing at least one signal or data operation, and a communication of data or signals between the components; and automatically converting the code into computer instructions for execution on an essentially sequential, non-parallel computer processor. An execution of the instructions on the sequential processor comprises (a) defining processing steps, wherein each one of the operations may only be performed once during each of the processing steps; (b) defining an associated event value for some of the outputs; (c) defining for each one of the operations having event values associated with a plurality of signal or data value inputs, an indication of priority associated with each one of the inputs; (d) setting the event value when the associated input or output signal or data value changes in a current one of the processing steps, and resetting the event value when the associated input or output signal or data value does not change in the current one of the processing steps, the event value being set or reset at an end of the current one of the processing steps; (e) selectively performing the operations during each of the processing steps when at least one of the event values is set for the input signals or data values specific to the operations, wherein the operations are performed in accordance with the priority; and (f) buffering the signal or data value outputs so as to prevent changes to them from being read by the inputs within a same one of the processing steps, and copying the buffered outputs at an end of each one of the processing steps so as to allow them to be read by the inputs in a next one of the processing steps. The code is automatically converted into hardware programming data for providing real-time hardware operation according to the code. The conversion comprising: including, in the hardware programming data, event control circuitry specification, priority control circuitry specification and buffering control circuitry specification to ensure that the hardware operation matches the execution on the sequential computer processor. The machine code is implemented using the hardware programming data on a hardware machine having parallel processing capability and using the computer instructions on the sequential processor in a manner that is essentially exchangeable.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Figure 1:
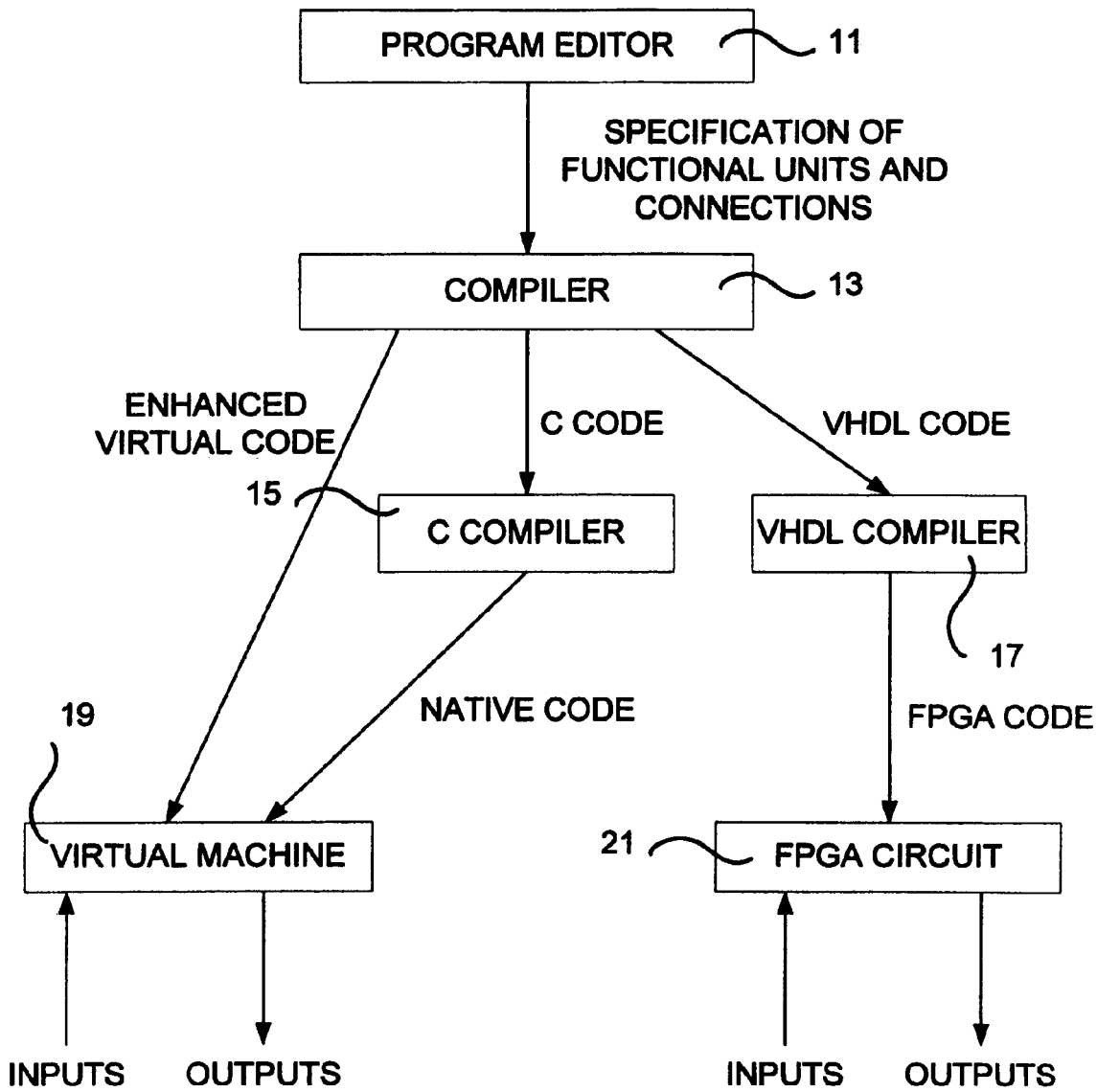
FIG. 1 is a block diagram of a system for compilation and execution of parallel programs according to the preferred embodiment of the present invention.

FIG. 1 illustrates a system for compilation and execution of parallel programs, comprising the typical components interacting in the type of programming environment according to the preferred embodiment of the present invention. The programming environment allows for multi-platform parallel machine programming, as well as multi-platform simulation. Such platforms include hardware circuits (FPGAs), sequential processors and parallel or networked sequential processors. The target machine also includes multi-processors, networked computers and mixed systems, such as in SOC system on chips.

A program editor 11 is used by a programmer to enter the source code. The source code is written using a programming language such as K3 in the preferred embodiment of the present invention. K3 is a programming language that allows programmers to target Field Programmable Gate Arrays (FPGAs) without requiring knowledge of a Hardware Description Language, such as VHDL. K3 provides the advantages of a high-level language to program FPGAs by using features such as, component-based structure, parallelism through events, parallel instruction execution, simultaneous event support through priorities, granularity to support concurrency and time management through synchronization.

The source code is to be written in a programming language with features as described above, using a text editor or a more sophisticated graphic editor. The result is a library of public and custom components, including interface ports, local variables and the functions to be executed. Using the component library, the programmer assembles the components in order to create a source code program. The source code program includes a list of external ports, a list of components and a list of connections.

The source code is then passed on to a compiler 13, which in the preferred embodiment of the present invention may provide either virtual code, C code or VHDL code. As known to a person skilled in the art, compiling the source code program consists of reading the source code, verifying the syntax and the semantics, in order to produce error information and the compiled code.

The programmer also edits the environment files, of which there may be a plurality, for example, for parallel execution and for simulation purposes. The environment files describe how local and/or network ports are associated to the external ports of the source code program.

The virtual code created is binary code ready to be loaded and run on a virtual machine 19. The C code needs to further be compiled by a C compiler 15, to also run on a virtual machine 19. The VHDL code is also compiled by a VHDL compiler 17 and the resulting file is used for programming an FPGA circuit 21.

The compiler 13 is the component responsible for translating source code into sequential code that is ready for execution or VHDL code for hardware programming. The compiler is language specific and contains features adapted to the programming language of choice. The following description is made in reference to a K3 programming language compiler.

Figure 2:
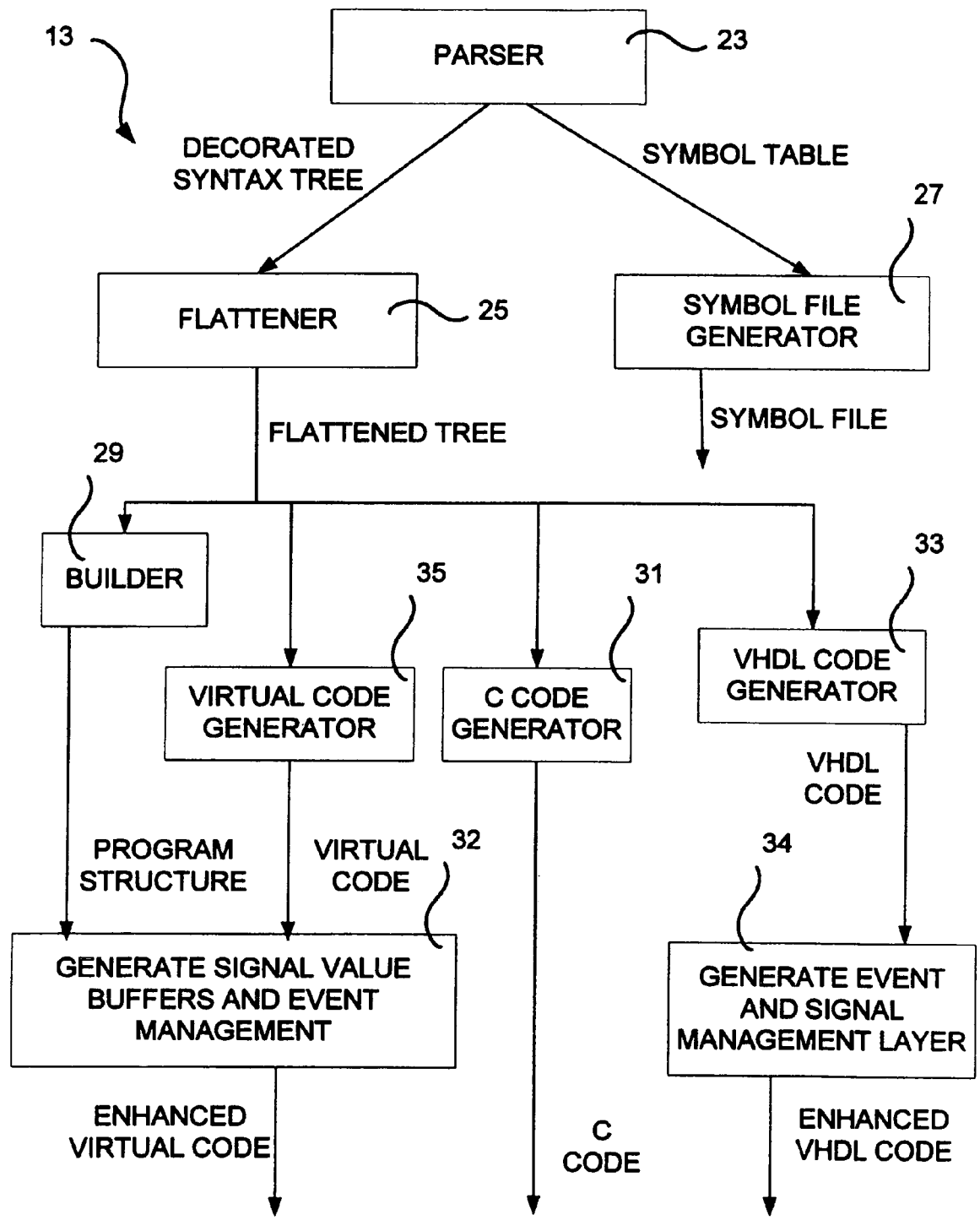
FIG. 2 is a block diagram of a compiler according to the preferred embodiment of the present invention.

The description is made in reference to FIG. 2 and it describes how the compiler should be constructed to produce data in a format ready to run on a virtual machine or to be compiled by a hardware compiler.

The compiler 13 reads the source code file, checks for errors and generates the virtual code, the C code or VHDL code, as specified by the programmer. The parser 23 is the compiler component that reads the source code file and constructs a decorated syntax tree according to compiling methods well known in the art. The decorated tree is a data structure in memory that normally contains the same information as the source code program, with the difference that now this information is validated and is known to be free of syntax errors.

The directory "C Code\FIG. 2—Flattened tree" contains the data structure definitions used for the decorated syntax tree and for the flattened tree, according to the preferred embodiment of the present invention.

At the same time, a symbol table is generated, containing the 'names' associated with each piece of information in the decorated syntax tree. The parser 23 also produces an error and message file, containing information allowing the programmer to fix any syntactic or semantic errors that the source code may contain.

The flattener module 25 then removes the abstract hierarchy of the decorated syntax tree to produce a flattened tree structure, which is a flat program made of interconnected components. The flattened tree is then passed on to a builder 29, a virtual code generator 35, a C code generator 31 or a VHDL code generator 33. The builder 29 uses the flattened tree structure to produce an internal data structure representing the program structure. This structure contains the list of components and connections between them, as well as component specific information. The internal machine data structure produced by the builder 29, contains all the information required to generate signal value buffers and event management 32 The data may be defined using linked lists or arrays.

Figure 3:
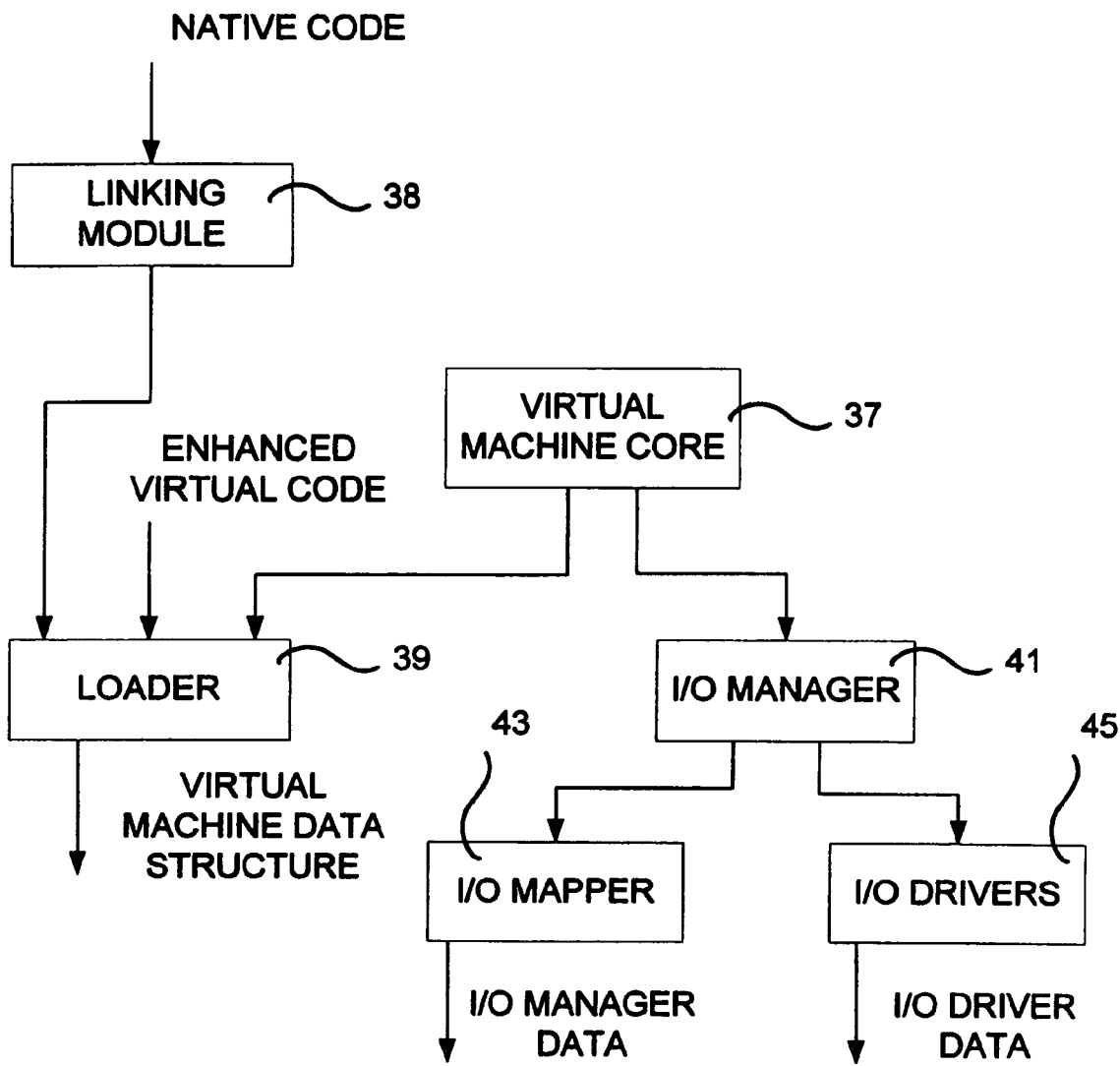
FIG. 3 is a block diagram of a virtual machine in program loading mode according to the preferred embodiment of the present invention.

The directory "C Code\FIG. 3—Virtual machine data structure" contains of the data structure definitions used for the program structure in FIG. 2 and also for the virtual machine data structure in FIG. 3, according to the preferred embodiment of the present invention.

The virtual code generator 35 translates executable functions into sequential virtual code compatible with the function evaluator of the virtual machine. The C code generator 31 translates the executable functions and generates corresponding C code, which similarly to virtual code, can be run on the virtual machine. The VHDL code generator 33 translates the executable functions into VHDL code which can be used to program FPGAs.

The virtual code and the program structure are provided to a module 32 which integrates them and serializes the information into an enhanced virtual code binary file readable by the virtual machine. If C code is used, the module 32 simply ignores the virtual code. Since both virtual code and C code are sequential types of code, they possess an important feature in order to simulate parallel execution behaviour. Each variable is duplicated and for each function in the code, two functions are generated. Of the two functions, one is responsible for carrying out the computations and for placing the results in temporary variables, while the other updates the results, by copying the contents of the temporary variables into the actual variables. The resulting code is enhanced virtual code, which will include virtual code, or references to compiled C code.

Similarly, the VHDL code is provided to a module 34 which creates an event and signal management layer. The enhanced virtual VHDL code includes the program structure, the added layer and the executable functions.

The virtual machine 19 is the component that de-serializes, loads and executes the enhanced virtual code on a single processor machine. The key features of this component are the management of events and the ability for parallel execution of functions. The virtual machine of the preferred embodiment of the present invention offers support for: associating events with functions using classes, associating priorities to classes, parallel and synchronous event processing, concurrent assignments using a 2-pass execution algorithm, concurrent events and assignments with a priority scheme and communication using shared variables. The description of the virtual machine will be divided according to its main modes of operation, program loading and program execution and will be done with respect to FIG. 3 and FIG. 4, respectively.

In program loading mode, the virtual machine 19 takes the enhanced virtual code and builds all the data structures necessary for efficient execution. The enhanced virtual code refers to virtual instructions. If C code is used, the compiled C code is linked, either statically or dynamically with the virtual machine code. Linking with the C code is done with callback functions, integrated and compiled with the C code. The virtual machine core 37 calls a loader 39 module to load the enhanced virtual code into memory in order initialize and build all the required data structures. The internal data structure produced by the loader 39 is an efficient and optimized data structure that contains all the information required by the virtual machine.

The directory "C Code\FIG. 3—Virtual machine data structure" contains of the data structure for the virtual machine and also the call back functions required for the linking process, according to the preferred embodiment of the present invention:

The virtual machine core module 37 then calls the I/O manager 41 to initialize I/o connections. The I/O mapper 43 is called to read the environment file and create I/O manager data structures. The I/O mapper 43 uses information linking physical ports to program ports from the environment file. The I/O mapper produces I/O manager data containing the list of all I/O drivers and their physical ports, as well as the link to the virtual code ports. Depending on implementation, complex or simple I/O management may be included in the system.

The I/O manager 41 loads all drivers and initializes each one by calling I/O drivers 45 module to create the Local and Network drivers data. Local drivers data contain driver specific code which are initialized at this stage. Network drivers data contains information regarding the ports that are published for network access. The virtual machine acts as server enabling clients to connect as commander or listener, depending on whether they wish to send or receive events.

Figure 4:
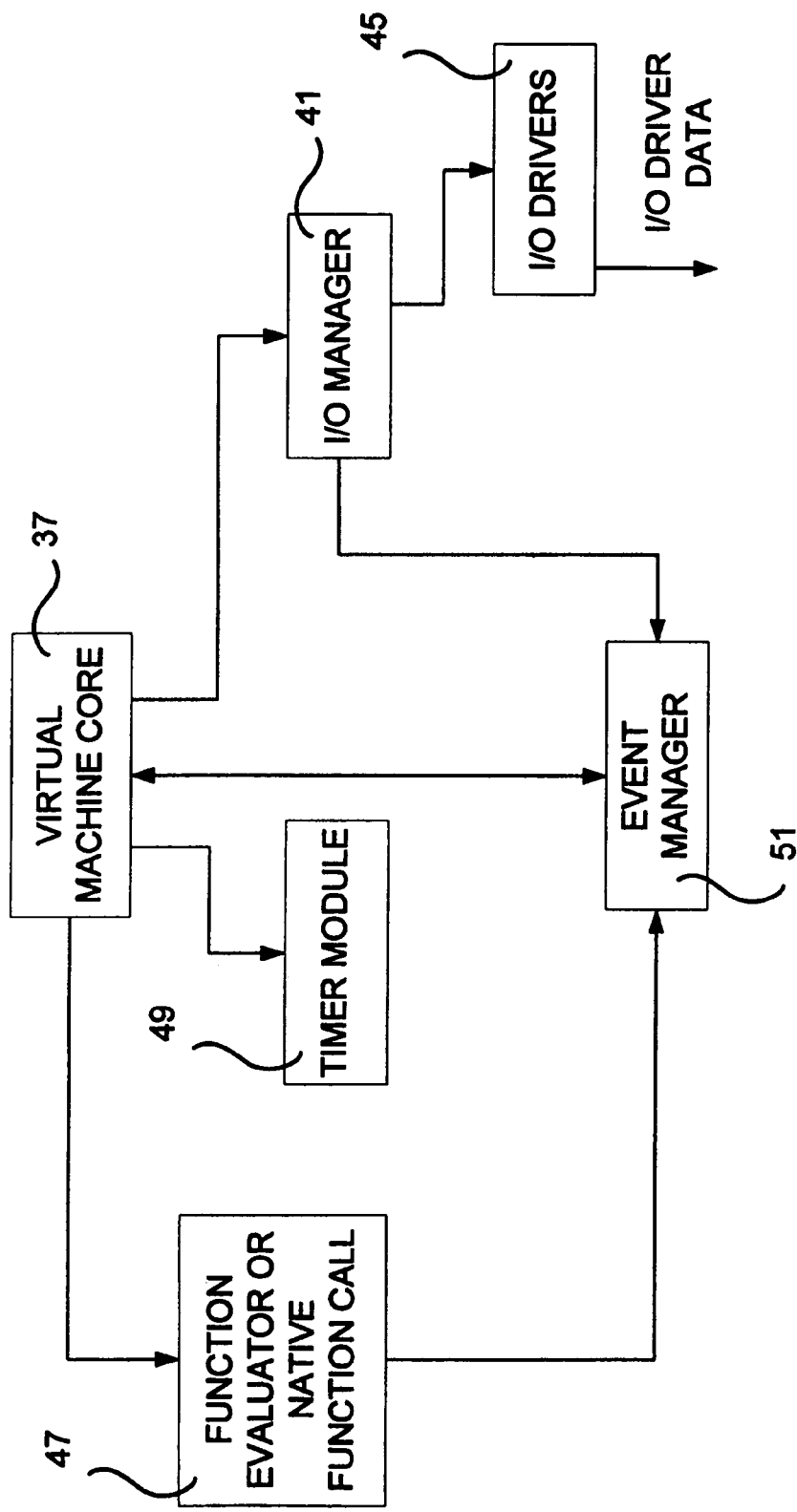
FIG. 4 is a block diagram of a virtual machine in program execution mode according to the preferred embodiment of the present invention.

In program execution mode, as shown in FIG. 4, following receipt of events from local or network I/O ports, the functions associated with each event are executed and output events are produced on local and/or network ports. First, the virtual machine core 37 receives a next event to process from the event manager 51 and calls the function evaluator 47 module to evaluate the function associated with that particular event. With C code, a call to the appropriate compiled C function is performed.

The virtual machine core 37 is the loop that synchronizes all operations. The loop scans the input ports for received events, triggers output events, checks timers and invokes the appropriate function associated with each event. In real-time mode, it also uses an algorithm to track the internal virtual machine time with respect to the real time.

The directory "C Code\FIG. 4—Virtual machine core" contains a simplified version of the loop code, according to the preferred embodiment of the present invention:

The event manager 51 manages a list of events, including a current step events list and a next step events list. The lists of events are not ordered chronologically but in order of class priority. Events are provided to the event manager 51 by the I/O manager 41, which scans the I/O drivers for input events. The events are read and removed from the list by the virtual machine core 37 loop according to their class priority.

The directory "C Code\FIG. 4—Event manager" contains the prototypes of the event manager 51 functions, according to the preferred embodiment of the present invention. Implementation of an event manager is well known in the art.

The function evaluator 47 evaluates each function in turn, based on received events or internal events. As a result of a function evaluation, assignments are made either to local variables or ports. If events are not simultaneous, then assignments are simply executed one after the other. In the case in which events occur simultaneously, the assignments are executed concurrently, according to their class priority. In the preferred embodiment of the present invention, the lower priority assignment is executed first, followed by the higher priority assignment, so that the higher priority assignment overwrites the lower priority value. The function evaluator 47 either interprets virtual instructions or calls native compiled C functions, the result being the same.

The function evaluator 47 may insert more events to be processed in a next step or start a timer for future events.

In a reactive synchronous system, each component may receive a plurality of events during the same step. These events may trigger the execution of a plurality of functions. Single-threaded components execute functions sequentially, while multi-threaded components support that functions associated with simultaneous events be executed simultaneously. In order to support multi-threaded components, in the preferred embodiment of the present invention, a special assignment mechanism is used.

As discussed above and as will be further explained below, function execution, and in particular variable assignment, is a two-phase process. First, all computations are performed and the result stored in temporary variables. On a second pass, the temporary variables are copied into the actual variables.

Figure 5:
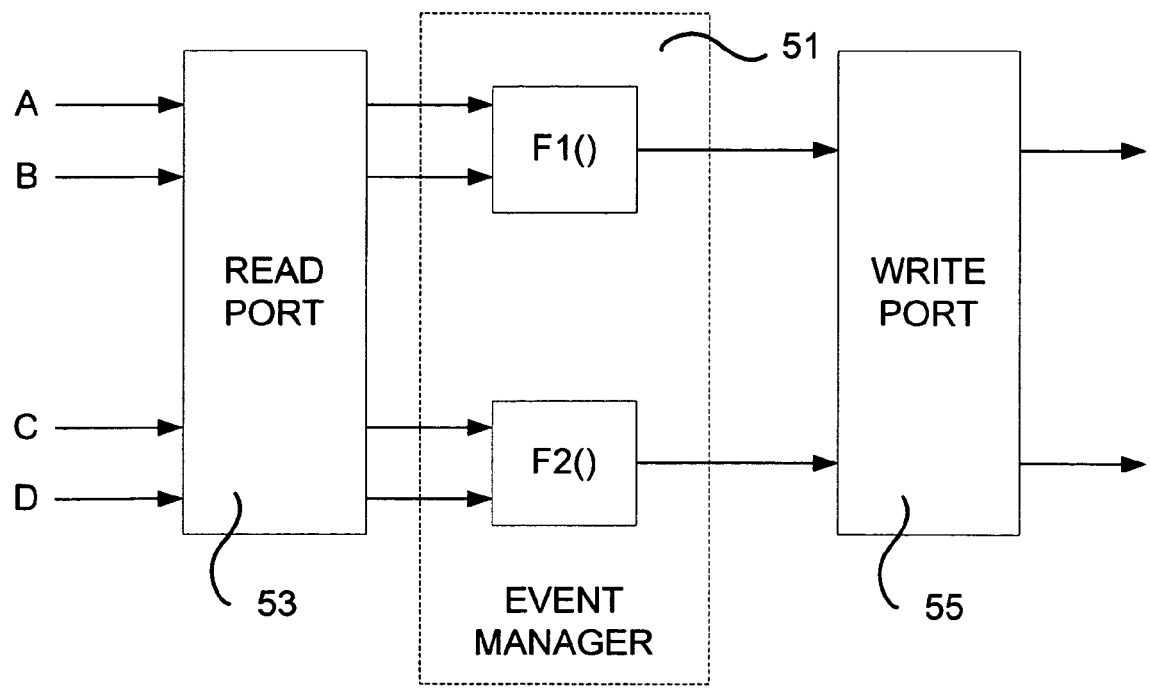
FIG. 5 is a block diagram of functions to be executed simultaneously on a sequential processor, according to the preferred embodiment of the present invention.

The I/O drivers 45 read from and write to the local or network ports attached to the virtual machine. For example, and as illustrated in FIG. 5, incoming signals are read by a read port module 53. The events are passed on to the event manager 51, which looks up the function corresponding to each generated event and triggers its execution. The results of the computation are passed on to a write port module 55, to be output on the output ports. The algorithm consists of an infinite loop that scans the inputs for events, manages the events, processes the corresponding functions and writes the output events.

In the preferred embodiment of the present invention, time advances in steps and is synchronized by a clock. All events occurring during a same step are considered simultaneous. For example, in FIG. 5, if signal A and signal C trigger events at the same time, functions f1( ) and f2( ) will be executed during the same step. We will assume for example that f1( ) is a function modifying a variable x and that f2( ) is a function reading the same variable x. On a sequential processor, either f1( ) or f2( ) will have to be executed first since they cannot be executed concurrently. The objective of the current programming paradigm is to ensure that the resulting state is the same whether f1( ) is executed first or not.

Other methods for tracking time could be implemented. For instance, multiple clocks or sub-clocks may be used. Clocks may also be time independent, meaning the computations advance in step, as fast as they can.

The method implemented in the preferred embodiment of the present invention is that of duplicating all the variables, such that there is one temporary variable for writing computation results and one variable for holding the actual values. On a first pass, all computations are executed and computation results are placed in temporary variables, while on a second pass, the values in the temporary variables are copied into the actual variables. This way, computation results are available in a next execution step.

Another feature of the present invention is that of handling multiple simultaneous assignments, which could occur as a result of functions being executed simultaneously. In order to allow simultaneous assignments to the same variable, a priority mechanism is used. According to the priority scheme, when multiple assignments to a variable are required, the one from the function with the highest priority will prevail.

In the preferred embodiment of the present invention, the priority mechanism consists of creating priority classes. Each input port is then associated to a class and then each class is associated with one function. Therefore, all events occurring simultaneously on ports of the same class will trigger the same associated function once. Priority may be defined for a single input or for a group of inputs.

Figure 6:
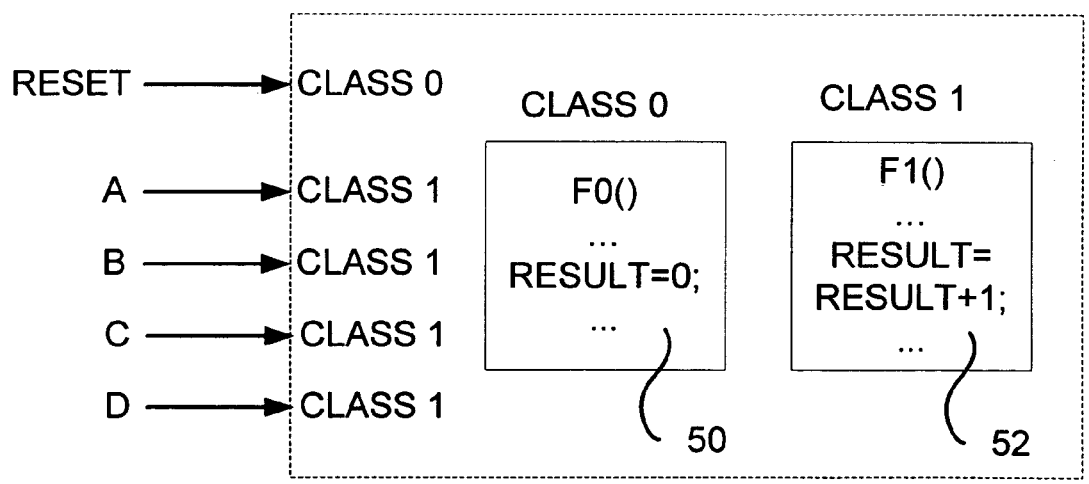
FIG. 6 is a block diagram of priority implementation for instructions to be executed on a sequential processor, according to the preferred embodiment of the present invention.

For example, and in reference to FIG. 6, assume two events arrive simultaneously on ports RESET and B. In that case, the function associated to the lower priority class will be executed first, that is function F1( ) of priority class 1 and RESULT will be evaluated to RESULT=RESULT+1. Then, the function associated to the highest priority class will be executed, and RESULT=0 will come into effect, overwriting the previous value of RESULT. Therefore, the final value for the variable RESULT will be 0, as expected according to priority.

In order to support priority classes, events are stored in multiple lists, with one list of events corresponding to each priority class level. Events are inserted in the list according to their priority, ensuring that event insertion is efficient and that event retrieval is done according to class priority.

An example, corresponding to FIG. 6, using K3 syntax is described later on. A good understanding of the example is recommended before proceeding with the remaining of the description.

Figure 7:
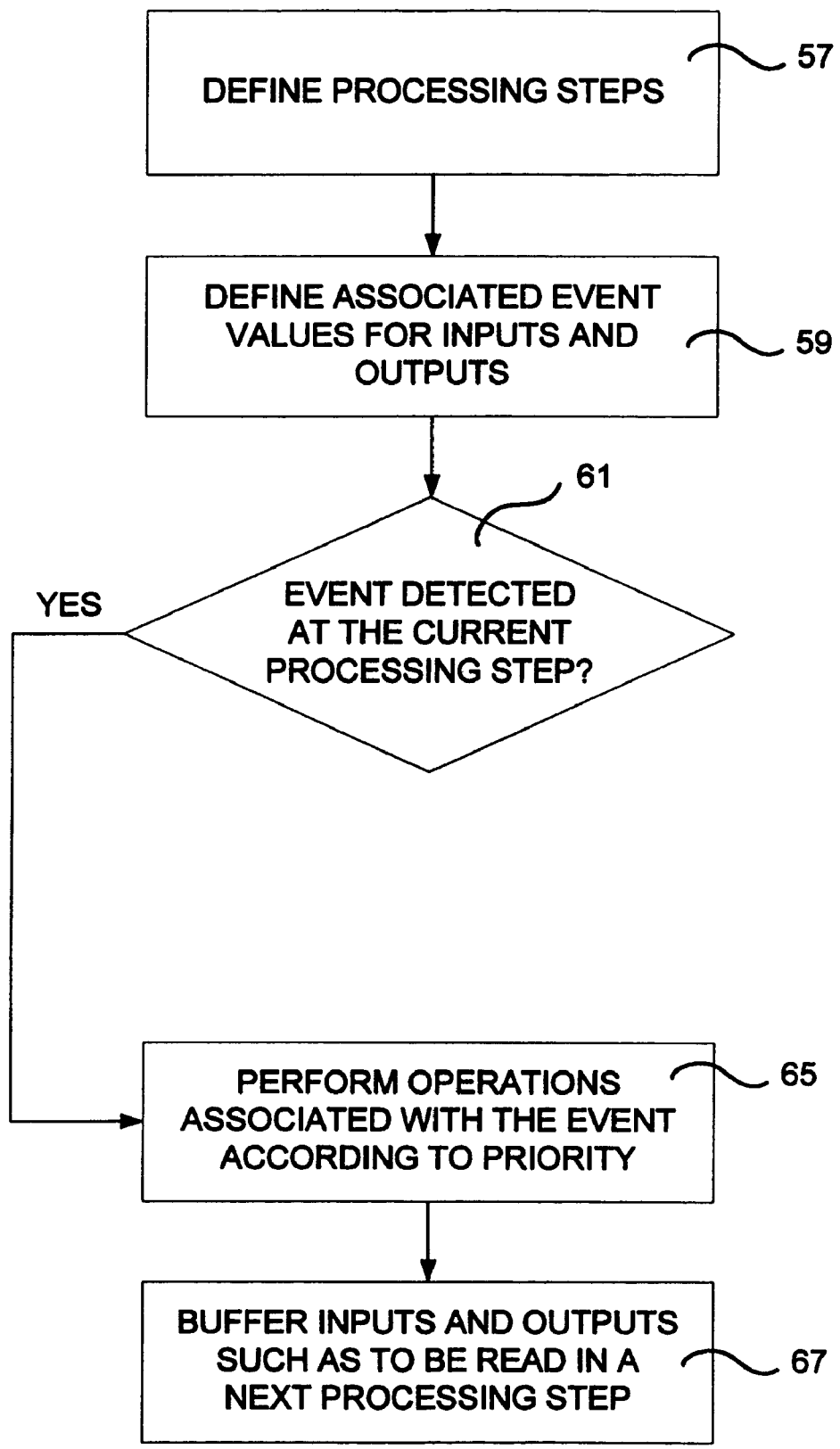
FIG. 7 is a flow chart of a method of executing parallel machine code on a non-parallel processor according to the preferred embodiment of the present invention.

The method described so far, illustrated in FIG. 7, provides a way for executing parallel code on a single processor machine. First, in accordance to step 57, the processing steps are defined. In the preferred embodiment of the present invention, the processing steps are defined by the programmer and are comprised in the source code. In fact, the actual processing steps will be determined at execution time and are based on real events and on triggered executed code, which in turn generates new events for the next step.

Then, the associated event values for inputs and outputs are defined 59, such that events may be detected on the inputs and signaled on the outputs. One method of defining events is detecting changes. According to this method, during execution, the input ports are monitored for changes in the input values 61. If input signals or data values change during the execution of a processing step, then the associated event value for that input is set for one step. Then, the operations associated with the set event are executed according to priority 65. In the preferred embodiment and as explained above, for simultaneous events, the method requires that lowest priority operations are executed first and highest priority operations last, this way ensuring that the result of the higher priority operations is effective. Then, in step 67, the signal or data value outputs are buffered in order to prevent changes to them from being read by inputs within the same processing step. At the end of the processing step, the buffered values are copied in order to allow them to be read by the inputs in the next processing step.

There exist other ways of generating events, such as, for example those generated by I/O drivers. For instance, events may be produced at regular intervals, such as in data acquisition, or at the arrival of an event from an external source, such as a client connected to the network.

Figure 8:
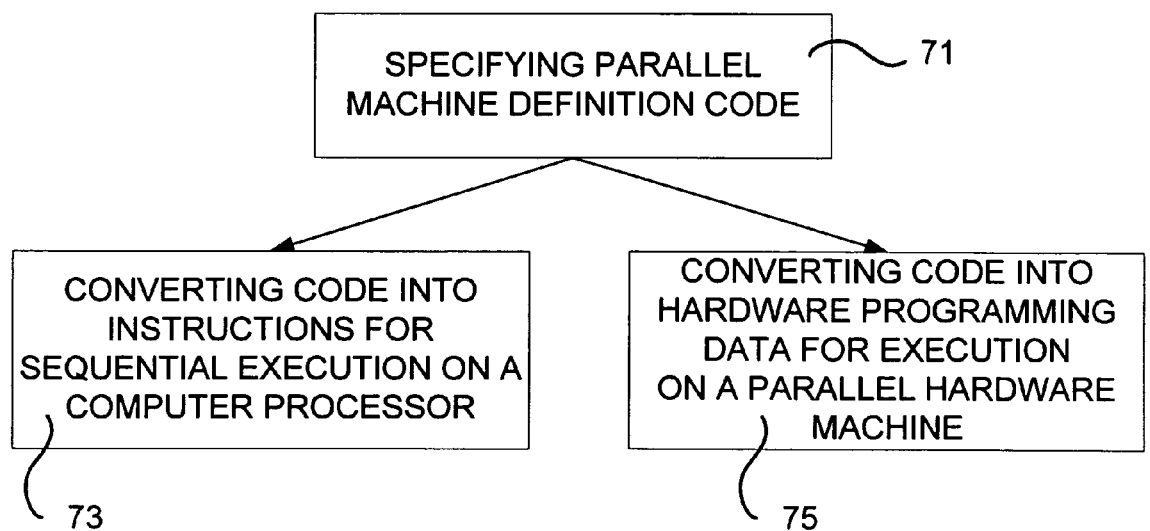
FIG. 8 is a flow chart of a method of multi-platform parallel machine programming, according to the preferred embodiment of the present invention.

FIG. 8 illustrates a method for multi-platform parallel machine programming including, first, specifying a parallel machine definition code 71. The source code defines a plurality of signals or data processing components and the way in which the components communicate with each other. The source code is automatically converted into computer instructions for execution on an essentially sequential, non-parallel computer processor 73, as has been described above and illustrated in FIG. 7.

A K3 program consists of a main component which includes external ports, internals components and connections. Each K3 internal component comprises its own ports, optional variables and executables functions. Each executable function is associated with a class of a given priority, and whose execution is triggered by an event on any input port of that class.

Execution of functions may lead to assignment to ports or variables and to event generation. Since an internal component may contain multiple classes and therefore executable functions, assignments are based on a priority scheme based on the class.

Now, the part of the system that translates source code into VHDL code for programming a hardware device will be described. The VHDL code generator 33, including 34, is the module that reads the flattened hierarchy and translates it into a format compatible with hardware devices and that may be used to program an FPGA. The target language for translation need not be VHDL, since any language may be used for programming integrated circuits.

Figure 9:
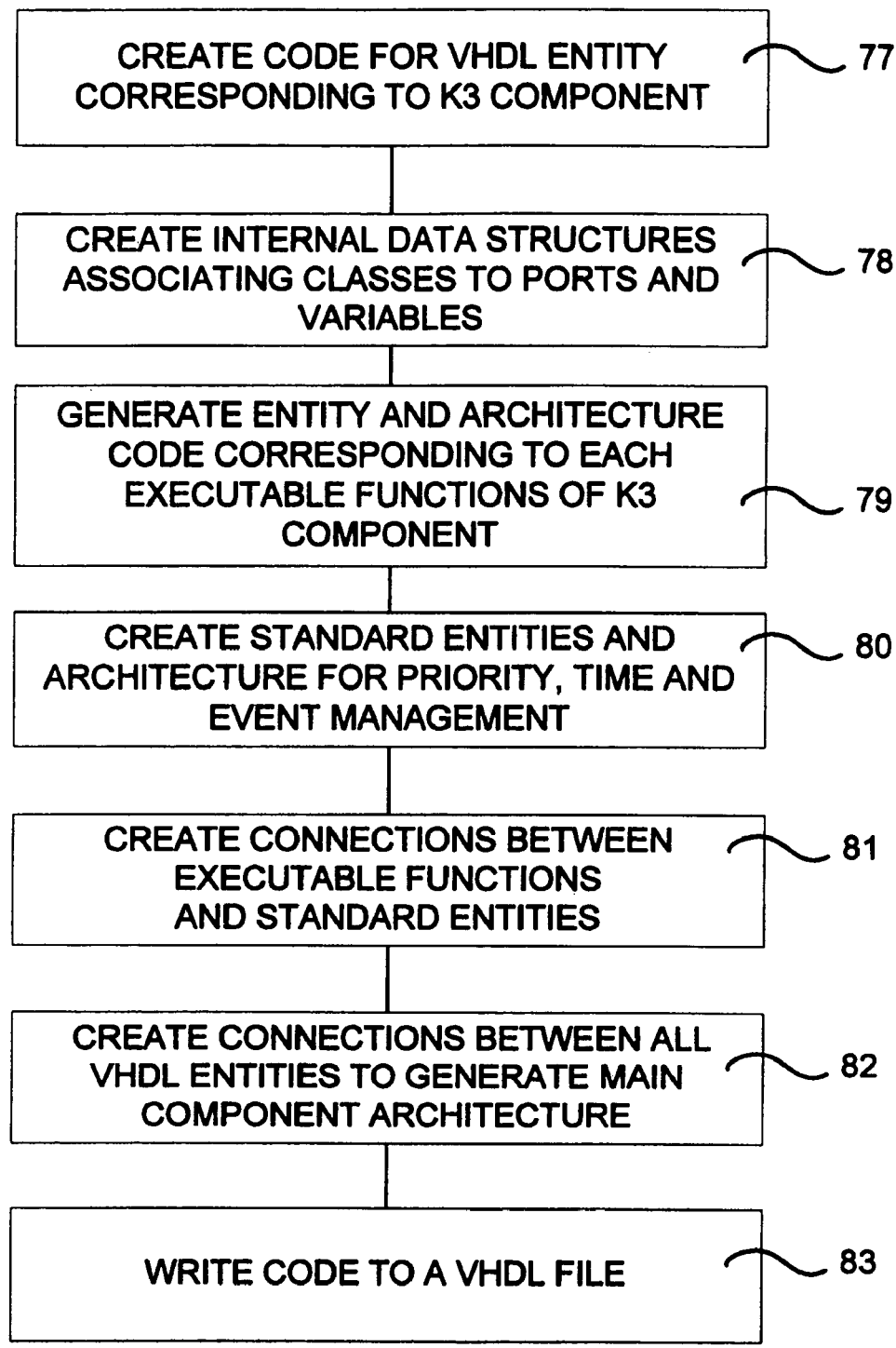
FIG. 9 is a flow chart of a method of converting code into hardware programming data for execution on a parallel hardware machine according to the preferred embodiment of the present invention.

In order to be compatible with the software implementation, the code is converted into hardware programming data for execution on a parallel hardware machine 75. As illustrated in FIG. 9, for each component during the conversion, event control circuitry specification, priority control circuitry specification, as well as buffering control circuitry specification are added. The hardware implementation is structured to associate events with functions using classes, to assign priorities to classes, to manage events in parallel, to support concurrent assignments initiated by different events, so support concurrent events and assignment by using a priority scheme and to support communication using shared variables.

FIG. 9 shows the steps of converting K3 code into hardware programming data for execution on a parallel hardware machine. The resulting main VHDL component will correspond to the main K3 component, consisting of interconnected VHDL components corresponding to the internal K3 components. Except for the added event signals, the architecture of the main VHDL component is a simple translation from K3.

Figure 10A:
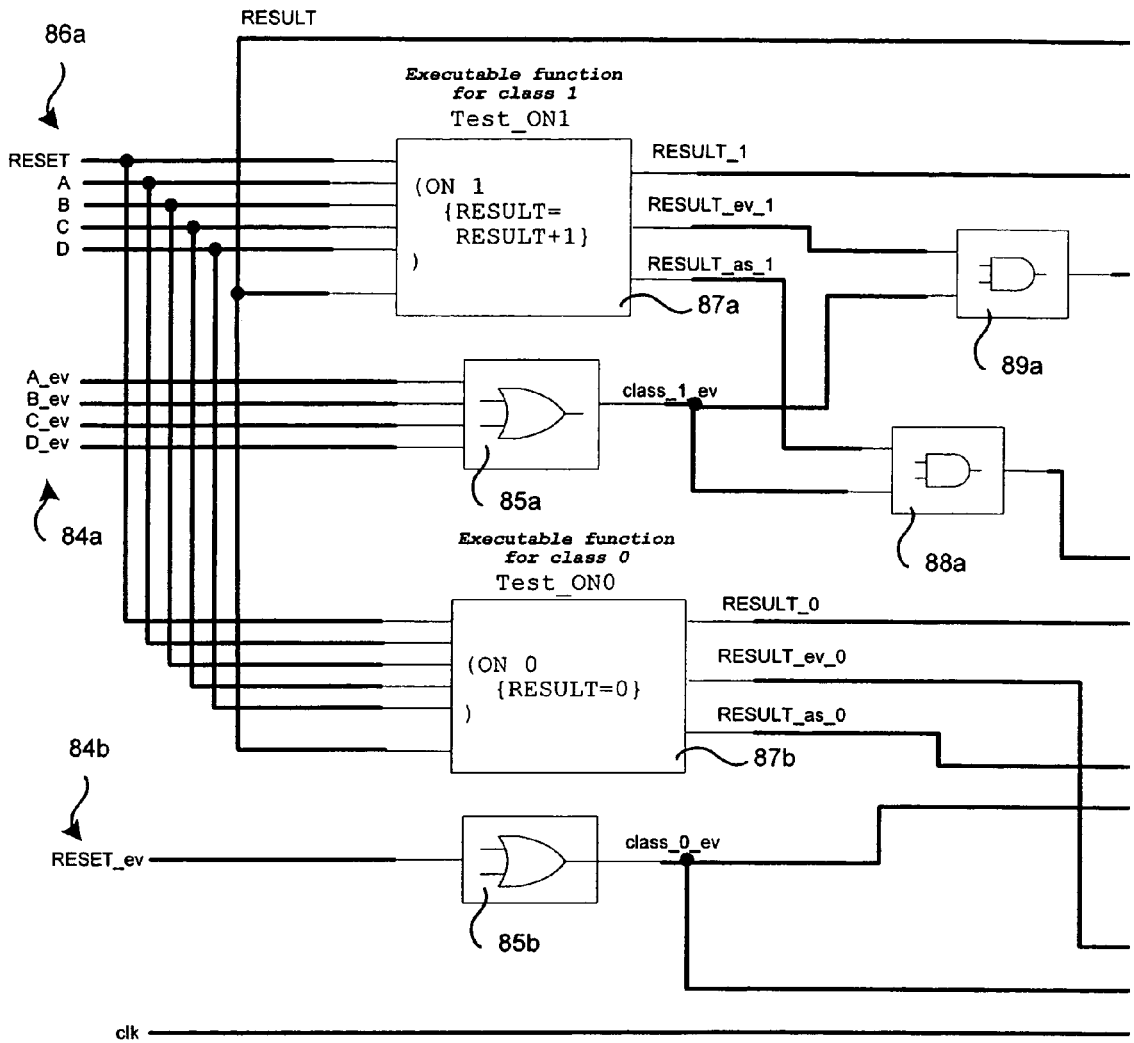
FIG. 10 is a block diagram of an exemplary hardware implementation of the functions illustrated in FIG. 6, according to the preferred embodiment of the present invention.
Figure 10B:
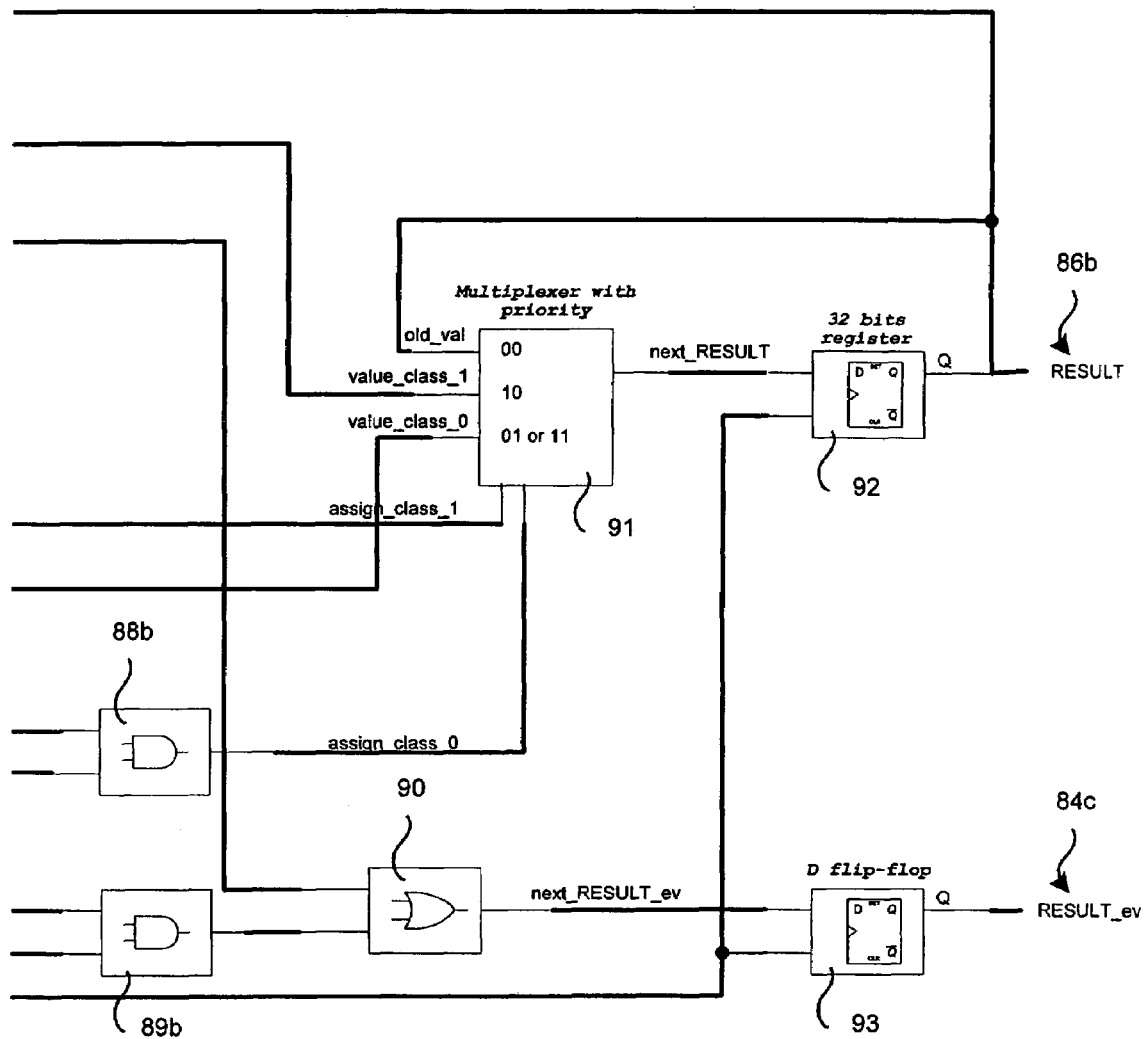

As shown in FIG. 10, each VHDL internal component will consist of ports, interconnected components for class, event and assignment management and one component for each executable function. In this example, there are two executable functions, component 87b corresponds to the functions associated to class 0, {RESULT=0} and component 87a corresponds to the function associated with class 1, {RESULT=RESULT+1}. This figure will be described in detail later on.

For a given K3 component, the component declaration and definition part includes an interface part and an implementation part. The interface defines the input and output ports, their type and their class priority value. The implementation part defines the executable function corresponding to each class.

Part of the VHDL instructions will be automatically generated, while other VHDL instructions will be translated from K3 instructions.

In a first step 77, the code for VHDL entity corresponding to a K3 component is created. In step 78, for that same K3 component, the internal data structures representing the associations of classes to ports (inputs and outputs) and variables are created.

Figure 11:
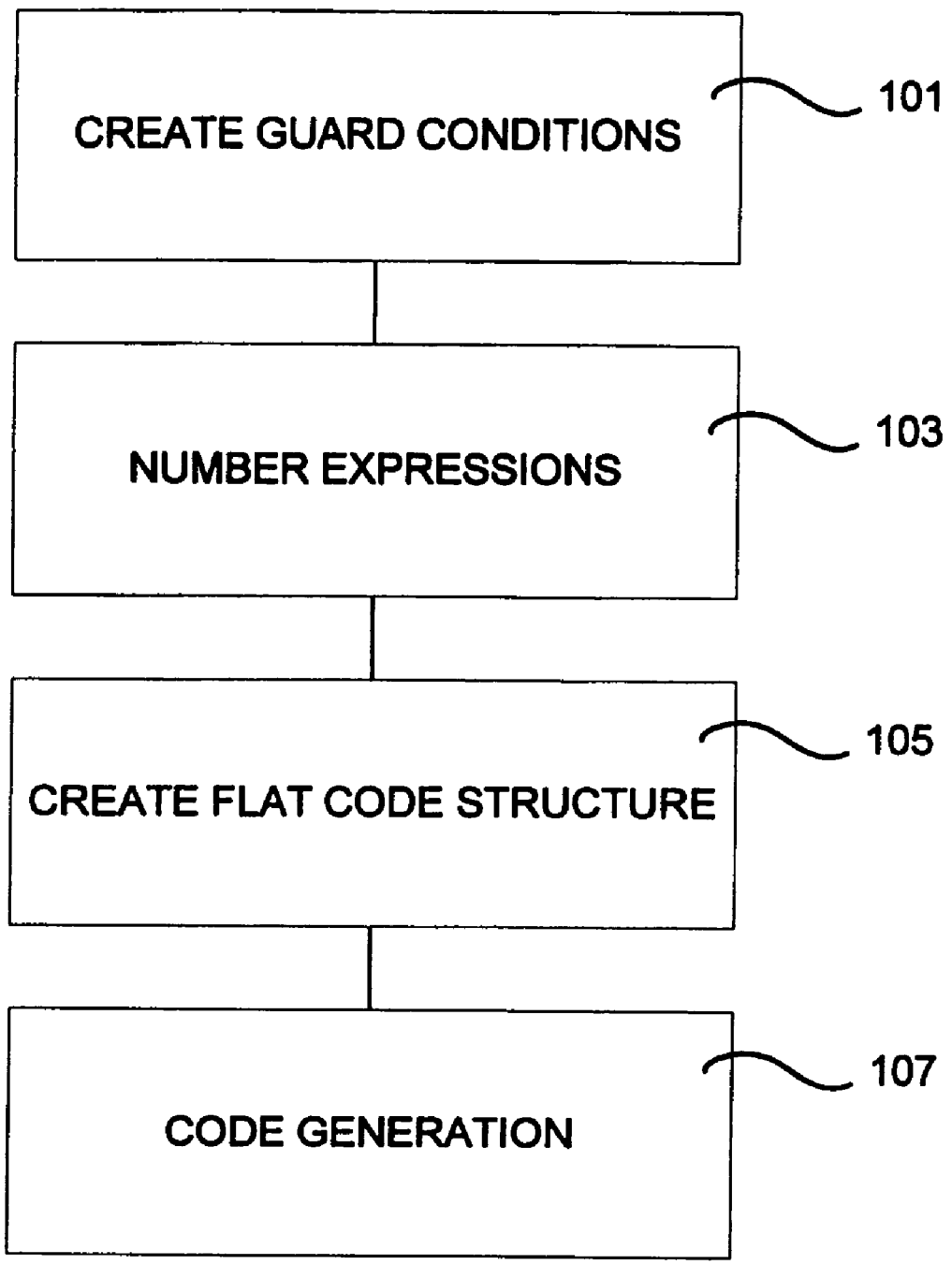
FIG. 11 is a block diagram of a method of generating entity and architecture code corresponding to each component, according to the preferred embodiment of the present invention.

At step 79, the architectural code for each executable functions of the K3 component is created in VHDL. The generation of architectural code corresponding to an executable function takes place in stages, as shown in FIG. 11. The goal of this step is to provide Boolean expressions for each port and variable, as well as Boolean variables indicating whether an assignment is necessary or whether an event must be signaled.

In a first stage 101, the conditional expressions, i.e. "if" and "switch" expressions and all their nested expressions, are extracted from the K3 code. The conditional expressions are used to create "guard conditions" using the condition inside the "if" or switch" or nested conditional expressions, the "guard condition" is the logical AND of their individual "guard conditions". All assignments to output ports or variables performed inside these nested conditional expressions are subject to the all "guard conditions" above it.

The processing of assignment statements requires a special algorithm in order to extract guard information and the corresponding values. Assignment may be found anywhere in a program, within conditional statements or outside conditional statement. Assignments can also be embedded within other assignments, for example here are a few possible statements:

1) <unconditional assignments>;
2) if <condition> then <assignments>;
3) if <condition> then <assignments> <else> <assignments>);
4) if <condition> then <assignments>
    else switch <value>
        case 0: <assignments>
        case 1: <various statements including assignments>
        case 1: <if statement>

Assignments may be done on any variables or ports, and guards are used to handle conditional expressions and assignments.

In a second stage 103, nested structures of arithmetic and logic expressions are flattened. A flattened structure is desired because VHDL language does not allow for certain nested structures, such as assignments, that exist in functional languages such as K3. First, each expression is given a number which corresponds to its place in the syntactic tree. Then, a VHDL signal is created to correspond to each expression. The signal name is then generated from the expression number.

In a third stage 105, the syntactic tree is recursively traversed in order to create a simpler structure for the code and extract complete assignment expressions.

In the preferred embodiment of the invention, the final assignment is constructed using simple OR functions. For each port or variable a canonical expression is constructed as follows:

$$X = G1.V1 + G2.V2 + G3.V3 + \ldots + Gn.Vn$$

Where <<.>> corresponds to logical AND and <<+>> logical OR. The identifier <<Gn>> corresponds to the guard (or the list of guards) number n, for the assignment of value <<Vn>> to X.

In the last stage 107, the code is written to the internal data structures created in step 78. In a first pass, the result of assignment expressions is written to a temporary signal, as there is no direct equivalent for assignment expressions in VHDL. Then, in a second pass, the temporary signals are assigned to ports, variables and timers, if they are used. Assignment signals and event signals are also defined on the second pass. An assignment signal is a signal that indicates whether, at the current or next step, a given port or variable is assigned a value in a given function. It is possible that no port or variable of a given class has been assigned to. In that case, the assignment signal for that port or variable is set to 0.

In the preferred embodiment of this invention, assignment using guards generates the following VHDL code.

```
for i in 0 to X'length generate
    X(i) <=  ( G1 and V1(i) ) or
             ( G2 and V2(i) ) or
             ( G3 and V3(i) ) or
             ... ;
end generate;
```

The <<for>> loop is required in VHDL to apply the Boolean expression to each bit of X, which will be assigned to the port or variable.

In addition, an output X_ev event signal indicates whether a given output port, signals an event and an output assignment signal indicates whether an assignment is required. An example of generated VHDL code is given below:

```
X_ev <=  (G1 and '1') or
         (G2 and '0') or
         (G3 and '1') or
         ... ;
```

-continued

```
X_as <=  (G1 and '0') or
         (G2 and '1') or
         (G3 and '1') or
         ... ;
```

In the code above, each guard is "and"ed with a constant '0' or '1', to enable or prevent the event or the assignment generation, depending on the program. If a "set" function is used, the constant for assignment will be "1", if an "out" function with a new value is used, both constant will be "1" and if a "out" function without new value is used, only the event constant is "1".

In the preferred embodiment, variables and output ports may be assigned a value with the "set" construct which is an assignment without event or with the "out" construct, which is an assignment with event or an event only. Port and variable assignments are always subject to "guard conditions".

In the next paragraphs, an example illustrating the code generated for the following K3 source code is presented:

```
(if a                       // Guard = a
    (if b                   // Guard = a AND b
        ( set X ( sub d e ) ) ) )
                            // Assignment without event
```

The guarded equation is: X=(a AND b) AND (d−e), meaning X=d−e, if (a AND b) is true, else it is zero.

In the preferred embodiment, the VHDL generated code is:

```
// Pass 1
// if return value
signal0 <= signal2 when a else 0;
// Guard << a >>.
signal1 <= a;
// if return value
signal2 <= signal4 when b else 0;
// Guard << b >>.
signal3 <= b;
// Assigned value
signal4 <= d − e;
// passe 2
G1 = signal1 and signal3;
for i in 0 to X'length −1 generate
    X <= G1 and signal4(i);
end generate;
// Assignment signal
X_as <= G1 and '1';
// Event signal, no event, only an assignment
X_ev <= G1 and '0';
```

This VHDL code is the basis of the executable function VHDL components 87a and 87b in FIG. 10.

Now, referring back to FIG. 9, this is followed by the creation, at step 80, of the standard entities for priority, time and event management. These entities correspond to items 85 and 88 to 93 in FIG. 10.

For each component, a VHDL schematic is created at step 81 with the necessary entities instantiated and the connections between the executable functions, the ports and the standard entities. This VHDL schematic is illustrated in FIG. 10.

Still referring to FIG. 9, steps 77 to 81 are repeated for all K3 components, so that in the end, for each K3 component, there exists an entity and an architectural description.

At step 82, all entities corresponding to K3 components are connected and a main VHDL component is created. Finally, at step 83, the VHDL code is written to a file. Alternatively, the VHDL code could be written to a file as it is generated at each step.

With respect to FIG. 10, the hardware implementation from a software description will now be described. To each component in the source code program must correspond an equivalent physical component in the hardware implementation. Inputs and outputs comprise one or many data wires 86 and event wires 84, if events are required. Data wires carry information and events are flag signals used to indicate an event.

The schematic on FIG. 10 is based on the example presented in the previous section. The component has four input ports A, B, C and D, being defined to have priority 1 and one input port RESET, having priority 0. The priority scheme used in the preferred embodiment is that the lowest number designates the highest priority. The source code component also has an output port, RESULT defined to be of the integer data type. The function associated with the component states that if an event arrives on an input port of class 0, then the output port RESULT is set to 0, and if an event arrives on an input port of class 1, then the RESULT value of is augmented by one.

The translation algorithm generates a hardware component having twice the number of ports of the software component and a clock port. Each input signal comprises a data port 86a, such as A, B, C, D, and RESET, and an event port 84a and 84b, such as A_ev, B_ev, C_ev, D_ev and RESET_ev. In the same way, each output signal comprises a data port 86b, RESULT, and en event port 86c, RESULT_ev.

In the preferred embodiment, a common clock is also provided to determine the length of a processing step, which may be a multiple of the clock period. In general, a processing step is one clock period, but a clock enable signal could be use to increase the effective clock period. Other means of varying the length of the step, such as clock enables, may be used.

The resulting hardware component and its logic function are automatically generated. If there is no input event, nothing changes and if an input event occurs, then the output value RESULT may change and an output event may be produced. On the next clock pulse or edge, the results are latched in the output registers 92 and 93.

The converting of code into hardware programming data for execution on a parallel hardware machine will now be explained by means of an example, such as the one illustrated in FIG. 10. Input events 84a and 84b are grouped by OR functions 85 according to the class they belong to. Input event RESET_ev is fed into an OR module 85b, in this case a simple buffer, belonging to class 0. The output of the OR gate is the event signal for class 0. Similarly, input events A_ev, B_ev, C_ev and D_ev, all belonging to class 1, are fed into an OR module 85a.

Each component comprises one executable function component 87 for each class. In the preferred embodiment of this invention, this component is a combinational component that produces three signals from the initial source code. For example, RESULT_1 is the value to be assigned to the output RESULT if an assignment is required for class 1. The signal RESULT_ev_1 indicates whether the computation requires an event and the signal RESULT_as_1 indicates whether the computation requires an assignment. These signals are generated for each port or variable and for each class in the component.

The OR modules 85 output class event signals, class_0_ev and class_1_ev, which are combined with assignment signals by AND gates 89, to drive the select lines for the selector module 91. Similarly, they are combined with the event signals by AND gates 89 and OR gate 90 to generate the event signal for the corresponding output, next_RESULT_ev.

The selector module 91 receives input values from executable functions for class 1, module 87a, and class 0, module 87b, and a feedback input of the current value of the output RESULT. The selector module selects which one of the inputs should be loaded into the output register 92. The selector module functions as follows:

1. If both assign signals assign_class_1 and assign_class_0 have the value 0, next_RESULT=old_val.
2. If assign_class_0=0 and assign_class_1=1, then next_RESULT=value_class_1.
3. If assign_class_0=1 and assign_class_1=0, then next_RESULT=value_class_0.
4. If assign_class_0=1 and assign_class_1=1, then two simultaneous assignments are required and in that case next_RESULT=value_class_0, since class 0 has a higher priority.

The output registers 92 and 93 are synchronized by a common clock. The values RESULT and RESULT_ev are stored in the output registers 92 and 93 on a change in the clock, usually the rising edge.

The method described of executing machine program code using an essentially sequential, non-parallel computer processor to provide a faithful facsimile of hardware signal or data processing, for real-time or parallel processing is dependant on the length of the step. The speed of execution on a sequential processor is considerably smaller than that of a FPGA, and therefore, for slow programs, the execution on hardware and that in software will be identical even as far as time characteristics are concerned. In the advent that the sequential processor does not have the processing power to execute in real-time and behave as the hardware, the sequential execution will be considered a simulation of the hardware. Yet, except for the length of the step, which will be simulated, the sequential execution will be identical to the hardware implementation.

It is to be appreciated that while the description of the preferred embodiment has been made in reference to a single sequential non-parallel computer processor, a plurality of sequential processors and hardware processors (FPGA) may be used, which could collaborate to execute the specified program code.

EXAMPLE

The program code listing below is used for illustrating the principles and teachings of the present invention. The listing includes a K3 program, which is a high level program code definition according to the preferred embodiment of the present invention, and the translations into C code and VHDL code performed according to the method of the present invention.

An example of a K3 program with a single component is as follows:

```
component main
  interface
    RESET : boolean (input 0);
    A : int (input 1);
    B : int (input 1);
    C : int (input 1);
    D : int (input 1);
    RESULT : int (output);
  implementation
    component Test
      interface
        RESET : boolean (input 0);
        A : int (input 1);
        B : int (input 1);
        C : int (input 1);
        D : int (input 1);
        RESULT : int (output);
      implementation
        (ON 0
          { RESULT = 0; }          //Assignment without event
        )
        (ON 1
          { RESULT := RESULT + 1; }
                                    //Assignment with event
        )
      end Test
    process
      P1 : Test;
    communication
      P1@RESULT RESULT ;
      RESET P1@RESET ;
      A P1@A ;
      B P1@B ;
      C P1@C ;
      D P1@D ;
end main
```

In the program, a component Test is defined to have an interface with input ports A, B, C and D of priority 1 and input port RESET of priority 0. An output port RESULT is also defined. The behaviour of the component is such that on receiving an event on a signal of priority 0, RESULT will be assigned the value "0". When receiving an event on a signal of priority 1, the value of RESULT will be incremented by 1.

In the process part of the program, a component is instantiated and in the "communication" part of the program the mapping of the ports for the component is provided.

The program above is compiled and translated into C code according to the method of the present invention, as seen below:

```
// PART - A
    #include <math.h>
    #include <ctype.h>
    #include <string.h>
    #include <stdlib.h>
    #include <memory. h>
    #include <stdio.h>
    #include "basic.h"
    typedef RODuint8 GencType__ubyte;
    typedef RODuint16 GencType__ushort;
    typedef RODuint32 GencType__uint;
    typedef RODuint64 GencType__ulong;
    typedef RODbool GencType__boolean;
    typedef RODint8 GencType__byte;
    typedef RODint16 GencType__short;
    typedef RODint32 GencType__int;
    typedef RODint64 GencType__long;
    typedef RODint64 GencType__time;
    typedef float GencType__float;
    typedef double GencType__double;
    typedef RODint32 GencType__fix32;
    typedef RODintG4 GencType__fix64;
    typedef RODint64 GencType__time;
    typedef RODuint8 GencType__bit;
// PART - B
    #include "geno__def.h"
    #include "genc__macro.h"
    4*include "genc__fct.h"
    #include "genc__rvm.h"
    static functPtrlnsertEvent__t InsertOutEvent = 0;
    static functTimeToStep__t timeToStep = 0;
    static functStartTimer__t startTimer = 0;
    static functStartTimer2__t startTimer2 = 0;
    static functStopTimer__t stopTimer = 0;
    static functSetTimer__t setTimer = 0;
    static functGetTimer__t getTimer = 0;
    static functGetScanperiod__t getScanPeriod = 0;
    static functPtrGetCompTimerPtr__t GetCompTimerPtr = 0;
    void* StructSignalTab [6];
// PART - C
    static GencType__boolean Signal__0
    static GencType__boolean Signal__1 ;
    static GencType__boolean Signal__2 ;
    static GencType__boolean Signal__3 ;
    static GencType__boolean Signal__4 ;
    static GencType__int signal__5
```

-continued

```
        static void Comp0__Class0__Pass0 (void);
        static void Comp0__Class0__Pass1 (void);
        static void Comp0__Class1__Pass0 (void);
        static void Comp0__Class1__Pass1 (void);
        void* compPtr__0__0;
// PART - D
    void* GetVariable( unsigned int NoComp, unsigned int NoVar )
    {
        switch( NoComp )
        {
            case 0:
            switch( NoVar )
            {
                default: return 0;
            }
            default: return 0;
        }
    }
    void SetFctInsertEvent ( functPtrInsertEvent__t functPtrInsertEvent )
    {
        InsertOutEvent = functPtrInsertEvent;
    }
    void SetFctTimeToStep( functTimeToStep__t functPtrTimeToStep )
    {
        timeToStep = functPtrTimeToStep;
    }
    void SetFctStartTimer( functStartTimer__t functStartTimer )
    {
        startTimer = functStartTimer;
    }
    void SetFctStartTimer2 ( functStartTimer2__t functStartTimer2 )
    {
        startTimer2 = functStartTimer2;
    }
    void SetFctStopTimer( functStopTimer__t functStopTimer )
    {
        stopTimer = functStopTimer;
    }
    void SetFctSetTimer( functSetTimer__t functSetTimer )
    {
        setTimer = functSetTimer;
    }
    void SetFctGetTimer( functGetTimer__t functGetTimer )
    {
        getTimer = functGetTimer;
    }
    void SetFctGetCompTimer
                ( functPtrGetCompTimerPtr__t functPtrGetCompTimerPtr )
    {
        GetCompTimerPtr = functPtrGetCompTimerPtr;
    }
    void SetFctGetScanPeriod( functGetScanPeriod__t functGetScanPeriod )
    {
        getscanPeriod = functGetScanPeriod;
    }
// PART - E
    void RegisterRctSignal( unsigned int NoSignal, void* pSignal )
    {
        StructSignalTab [ NoSignal ] = pSignal;
    }
    void GencResetAllTempFlag ( )
    {
    }
// PART - F
    void* GetSignal( unsigned int NoSignal )
    {
        switch( NoSignal )
            {
            case 0:
                return &Signal__0;
            break;
            case 1:
                return &Signal__1;
            break;
            case 2:
                return &Signal__2;
            break;
            case 3:
                return &Signal__3;
```

```
                break;
            case 4:
                return &Signal_4;
                break;
            case 5:
                return &Signal_5;
                break;
            default:
                return 0;
                break;
        }
    }
// PART - G
    void InitCompTimerPtrFct( )
    {
        compPtr_0_0 = GetCompTimerPtr ( 0 );
    }
    functPtr GetFctOnPtr( unsigned int NoInstance,
                          unsigned int NoClass,
                          unsigned int NoPass )
    {
        switch( NoInstance )
        {
            case 0:
                switch( NoClass )
                {
                    case 0:
                        switch( NoPass )
                        {
                            case 0:
                                return &Comp0_Class0_Pass0;
                            break;
                            case 1:
                                return &Comp0_Class0_Pass1;
                            break;
                            default:
                                return 0;
                            break;
                        }
                    break;
                    case 1:
                        switch( NoPass )
                        {
                            case 0:
                                return &Comp0_Class1_Pass0;
                            break;
                            case 1:
                                return &Comp0_Class1_Pass1;
                            break;
                            default:
                                return 0;
                            break;
                        }
                    break;
                    default:
                        return 0;
                    break;
                }
            break;
            default:
                return 0;
            break;
        }
    }
    functPtr GetFctOnTimerEnd( unsigned int NoInstance,
                               unsigned int NoPass )
    {
        switch( NoInstance )
        {
            case 0:
                return 0;
                break;
            default:
                return 0;
                break;
        }
    }
    functPtr GetFctOnStart( unsigned int NoInstance,
                            unsigned int NoPass )
```

-continued

```
    {
        switch ( NoInstance )
        {
            case 0:
                return 0;
                break;
            default:
                return 0;
                break;
        }
    }
    functPtr GetFctOnStop( unsigned int NoInstance,
                           unsigned int NoPass )
    {
        switch( NoInstance )
        {
            case 0:
                return 0;
                break;
            default:
                return 0;
                break;
        }
    }
```

```
// PART - H
    // Code for implementing the two passes, required to simulate
    // parallelism
    static GencType_int    t_Pl_SetOutPortTemp11 = 0;
    static void Comp0_Class0_Pass0 (void)
    {
        ( t_Pl_SetOutPortTemp11 = 0 );
    }
    static void Comp0_Class1_Pass0 (void)
    {
        ( t_Pl_SetOutPortTemp11 = ( Signal_5 + 1 ) );
    }
    static void Comp0_Class0_Pass1 (void)
    {
        InsertOutEvent( StructureSignalTab [5], 1 );
        Signal_5 = t_Pl_SetOutPortTemp11;
    }
    static void Comp0_Class1_Pass1 (void)
    {
        InsertOutEvent( StructSignalTab [5], 0 );
        Signal_5 = t_ Pl_SetOutPortTemp11;
    }
```

The part of C program code that is contained in the box is the part corresponding to the two passes of execution for each "ON" function, required to simulate parallelism on a sequential processor. This part is translated from K3 source code, whereas everything else is automatically generated.

For discussion, the generated C code is separated into height parts as follow. This code corresponds to the preferred embodiment of the present invention. This C code was generated according to paragraph 28 to 31.

Part A contains the basic declaration and included files.

Part B contains the declaration and the included files specific for the generation of C code, common to all components. Once initialized by the linking module 38 and loader module 39, theses functions enable the compiled native code to call-back the required function of the virtual machine core 37.

Part C contains specific declaration of variables and functions associated with the current program, six variables corresponding to the six ports and four functions for each of the two pass of class functions 0 and 1.

Part D contains the function definitions for the functions that are called by the virtual machine core 37 to set pointers to call-back functions.

Part E contains the code required to associate the virtual machine 37 signals to the generated C code variables. The function GencResetAllTempFlag( ) is used by the virtual machine core 37 to indicate the end of a step and reset the flag indicating that all temporary variables must be evaluated at the next step.

Part F contains the code to enable the virtual machine core 37 to access the compiled C code variables in the virtual machine data structrue. The function "Get Signal" returns a pointer to the desired variable storage.

Part G contains the functions that enables the virtual machine core to initialize its internal pointers to the call-back functions corresponding to the executable functions of the program.

Finally, part H contains the code of these call-back functions. These functions enable the virtual machine core 37 to access the compiled C code function for each component and each class, according to the pass 47.

Enhanced VHDL code is also provided, containing an event and signal management layer, as shown below:

```
-- PART - A
   library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

package user is
   component main is port
     (
       port_A : in bit_vector( 0 downto 0 );
       port_A_ev : in bit;
       port_RESULT : out bit_vector( 31 downto 0 );
       port_RESULT_ev : out bit;
       port_B : in bit_vector( 0 downto 0 );
       port_B_ev : in bit;
       port_C : in bit_vector( 0 downto 0 );
       port_C_ev : in bit;
       port_D : in bit_vector( 0 downto 0 );
       port_D_ev : in bit;
       port_RESET : in bit_vector( 0 downto 0 );
       port_RESET_ev : in bit;
       start : in bit;
       clk : in bit );

end component;

component Test is port
```

```
  (
    clk : in bit;
    port_A : in boolean;
    port_A_ev : in bit;
    port_B : in boolean;
    port_B_ev : in bit;
    port_C : in boolean;
    port_C_ev : in bit;
    port_D : in boolean;
    port_D_ev : in bit;
    port_RESET : in boolean;
    port_RESET_ev : in bit;
    port_RESULT : out signed( 31 downto 0 );
    port_RESULT_ev : out bit;
    start : in bit );
  end component;

component Test_ON0 is port
    (
    port_A : in boolean;
    port_B : in boolean;
    port_C : in boolean;
    port_D : in boolean;
    port_RESET : in boolean;
    port_RESULT : inout signed( 31 downto 0 );
    port_RESULT_ev : out bit;
    port_RESULT_old : in signed( 31 downto 0 );
    port_RESULT_as : out bit;
    timer_value_in : in signed( 63 downto 0 );
    timer_value_out : out signed( 63 downto 0 );
    start_timer : out bit;
    stop_timer : out bit;
    timer_as : out bit );
  end component;

component Test_ON1 is port
    (
    port_A : in boolean;
    port_B : in boolean;
    port_C : in boolean;
    port_D : in boolean;
    port_RESET : in boolean;
    port_RESULT : inout signed( 31 downto 0 );
    port_RESULT_ev : out bit;
    port_RESULT_old : in signed( 31 downto 0 );
    port_RESULT_as : out bit;
    timer_value_in : in signed( 63 downto 0 );
    timer_value_out : out signed( 63 downto 0 );
    start_timer : out bit;
    stop_timer : out bit;
    timer_as : out bit );
```

```
end component;

component AND2STD is
port
(
  I0 : in bit;
  I1 : in bit;
  O : out bit
);
end component;

component multiOr_1
is
port
(
 input : in bit;
 output : out bit );
end component;

component multiOr_4
is
port
(
 input : in bit_vector( 3 downto 0 );
 output : out bit );
end component;

component MUXPRIO_2_int
is
port
(
  AsIn : bit_vector( 1 downto 0 ) ;
  valC0 : in signed( 31 downto 0 );
  valC1 : in signed( 31 downto 0 );
  oldVal : in signed( 31 downto 0 );
  outVal : out signed( 31 downto 0 ) );
end component;

component FFD_int
is
port
(
 d : in signed( 31 downto 0 );
 q : out signed( 31 downto 0 );
 clk : in bit );
end component;

component multiOr_2
is
port
```

```vhdl
(
 input : in bit_vector( 1 downto 0 );
 output : out bit );
end component;

component FFD_bit
is
port
(
 d : in bit;
 q : out bit;
 clk : in bit );
end component;

component MUXPRIO_2_time
is
port
(
  AsIn : bit_vector( 1 downto 0 ) ;
  valC0 : in signed( 63 downto 0 );
  valC1 : in signed( 63 downto 0 );
  oldVal : in signed( 63 downto 0 );
  outVal : out signed( 63 downto 0 ) );
end component;

end package user;

-- PART - B
   library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

use work.user.all;

entity main is port
     (
       port_A : in bit_vector( 0 downto 0 );
       port_A_ev : in bit;
       port_RESULT : out bit_vector( 31 downto 0 );
       port_RESULT_ev : out bit;
       port_B : in bit_vector( 0 downto 0 );
       port_B_ev : in bit;
       port_C : in bit_vector( 0 downto 0 );
       port_C_ev : in bit;
```

```
    port_D : in bit_vector( 0 downto 0 );
    port_D_ev : in bit;
    port_RESET : in bit_vector( 0 downto 0 );
    port_RESET_ev : in bit;
    start : in bit;
    clk : in bit );

end main;

-- PART - C
   library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

use work.user.all;

entity Test is port
     (
       clk : in bit;
       port_A : in boolean;
       port_A_ev : in bit;
       port_B : in boolean;
       port_B_ev : in bit;
       port_C : in boolean;
       port_C_ev : in bit;
       port_D : in boolean;
       port_D_ev : in bit;
       port_RESET : in boolean;
       port_RESET_ev : in bit;
       port_RESULT : out signed( 31 downto 0 );
       port_RESULT_ev : out bit;
       start : in bit );
   end Test;

-- PART - D
   library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

use work.user.all;
```

```vhdl
entity Test_ON0 is port
  (
    port_A : in boolean;
    port_B : in boolean;
    port_C : in boolean;
    port_D : in boolean;
    port_RESET : in boolean;
    port_RESULT : inout signed( 31 downto 0 );
    port_RESULT_ev : out bit;
    port_RESULT_old : in signed( 31 downto 0 );
    port_RESULT_as : out bit;
    timer_value_in : in signed( 63 downto 0 );
    timer_value_out : out signed( 63 downto 0 );
    start_timer : out bit;
    stop_timer : out bit;
    timer_as : out bit );
end Test_ON0;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity Test_ON1 is port
  (
    port_A : in boolean;
    port_B : in boolean;
    port_C : in boolean;
    port_D : in boolean;
    port_RESET : in boolean;
    port_RESULT : inout signed( 31 downto 0 );
    port_RESULT_ev : out bit;
    port_RESULT_old : in signed( 31 downto 0 );
    port_RESULT_as : out bit;
    timer_value_in : in signed( 63 downto 0 );
    timer_value_out : out signed( 63 downto 0 );
    start_timer : out bit;
    stop_timer : out bit;
    timer_as : out bit );
end Test_ON1;

architecture ON0 of Test_ON0 is
signal G0 : unsigned( 0 downto 0 );
signal SignalExp_0 : signed( 31 downto 0 );
constant k0 : signed( 31 downto 0 ) :=
b"00000000000000000000000000000000";
```

```
begin timer_as <= '0';
start_timer <= '0';

stop_timer <= '0';

SignalExp_0 <= k0;

G0 <= toBit( true );
A0 : for i in 0 to 31
 generate port_RESULT(i) <= ( G0(0) and SignalExp_0(i) ) or
'0' ;

end generate A0;

port_RESULT_as <= ( toSimpleBit( G0 ) and '1' ) or
'0';
port_RESULT_ev <= ( toSimpleBit( G0 ) and '0' ) or
'0';
end ON0;

architecture ON1 of Test_ON1 is
signal SignalExp_1 : signed( 31 downto 0 );
signal G1 : unsigned( 0 downto 0 );
signal SignalExp_0 : signed( 31 downto 0 );
constant k0 : signed( 31 downto 0 ) :=
b"00000000000000000000000000000001";
begin timer_as <= '0';
start_timer <= '0';

stop_timer <= '0';

SignalExp_1 <= ( port_RESULT_old + k0 );
SignalExp_0 <= SignalExp_1;

G1 <= toBit( true );
A1 : for i in 0 to 31
 generate port_RESULT(i) <= ( G1(0) and SignalExp_0(i) ) or
'0' ;

end generate A1;
```

```vhdl
port_RESULT_as <= ( toSimpleBit( G1 ) and '1' ) or
'0';
port_RESULT_ev <= ( toSimpleBit( G1 ) and '1' ) or
'0';
end ON1;

-- PART - E
   library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

use work.user.all;

entity AND2STD is
   port
   (
     I0 : in bit;
     I1 : in bit;
     O  : out bit
   );
   end AND2STD;

architecture comportemental of AND2STD is begin O <= I0 and I1;
   end comportemental;

library ieee;

use ieee.std_logic_1164.all;
   use ieee.numeric_std.all;
   use ieee.std_logic_unsigned.all;
   use work.ctype.all;
   use work.conversion.all;
   use work.RodinStd.all;

use work.user.all;

entity multiOr_1
   is
   port
   (
    input : in bit;
    output : out bit );
   end multiOr_1;

architecture comportemental of multiOr_1 is begin output <= input;
``` end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity multiOr_4
is
port
(
  input : in bit_vector( 3 downto 0 );
  output : out bit );
end multiOr_4;

architecture comportemental of multiOr_4 is begin output <= input( 0 ) or input( 1 ) or input( 2 ) or input( 3 );

end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity MUXPRIO_2_int
is
port
(
   AsIn : bit_vector( 1 downto 0 ) ;
   valC0 : in signed( 31 downto 0 );
   valC1 : in signed( 31 downto 0 );
   oldVal : in signed( 31 downto 0 );
   outVal : out signed( 31 downto 0 ) );
end MUXPRIO_2_int;

architecture comportemental of MUXPRIO_2_int
is

```vhdl
begin
 outVal <= oldVal when AsIn = b"00"
 else
  valC0 when AsIn( 0 downto 0 ) = b"1"
 else
  valC1 when AsIn( 1 downto 0 ) = b"10"
else b"00000000000000000000000000000000";
end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity FFD_int
is
port
(
 d : in signed( 31 downto 0 );
 q : out signed( 31 downto 0 );
 clk : in bit );
end FFD_int;

architecture comportemental of FFD_int is
 signal sq : signed( 31 downto 0 );
begin sq <= d when ( clk'event and clk = '1' ) else sq;
 q <= sq;

end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity multiOr_2
is
port
```

```vhdl
(
 input : in bit_vector( 1 downto 0 );
 output : out bit );
end multiOr_2;

architecture comportemental of multiOr_2 is begin output <= input( 0 ) or input( 1 );

end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;

entity FFD_bit
is
port
(
 d : in bit;
 q : out bit;
 clk : in bit );
end FFD_bit;

architecture comportemental of FFD_bit is
 signal sq : bit;
begin sq <= d when ( clk'event and clk = '1' ) else sq;
 q <= sq;

end comportemental;

library ieee;

use ieee.std_logic_1164.all;
use ieee.numeric_std.all;
use ieee.std_logic_unsigned.all;
use work.ctype.all;
use work.conversion.all;
use work.RodinStd.all;

use work.user.all;
```

```
entity MUXPRIO_2_time
is
port
(
  AsIn : bit_vector( 1 downto 0 ) ;
  valC0 : in signed( 63 downto 0 );
  valC1 : in signed( 63 downto 0 );
  oldVal : in signed( 63 downto 0 );
  outVal : out signed( 63 downto 0 ) );
end MUXPRIO_2_time;

architecture comportemental of MUXPRIO_2_time
is
begin
 outVal <= oldVal when AsIn = b"00"
 else
   valC0 when AsIn( 0 downto 0 ) = b"1"
 else
   valC1 when AsIn( 1 downto 0 ) = b"10"
 else
b"0000000000000000000000000000000000000000000000000000000000000000";
end comportemental;

-- PART - F
   architecture structurelle of Test is signal Class_0 : bit;
   signal sig_timer_start_0 : bit;
   signal sig_timer_stop_0 : bit;
   signal sig_timer_as_0 : bit;
   signal sig_timer_start_bef_0 : bit;
   signal sig_timer_stop_bef_0 : bit;
   signal sig_timer_mux_0 : bit;
   signal sig_timer_value_0 : signed( 63 downto 0 );

signal Class_1 : bit;
   signal sig_timer_start_1 : bit;
   signal sig_timer_stop_1 : bit;
   signal sig_timer_as_1 : bit;
   signal sig_timer_start_bef_1 : bit;
   signal sig_timer_stop_bef_1 : bit;
   signal sig_timer_mux_1 : bit;
   signal sig_timer_value_1 : signed( 63 downto 0 );

signal port_A_0 : boolean;

signal port_A_1 : boolean;

signal port_B_0 : boolean;
```

```
signal port_B_1 : boolean;

signal port_C_0 : boolean;

signal port_C_1 : boolean;

signal port_D_0 : boolean;

signal port_D_1 : boolean;

signal port_RESET_0 : boolean;

signal port_RESET_1 : boolean;

signal port_RESULT_0 : signed( 31 downto 0 );
signal port_RESULT_ev_0 : bit;
signal port_RESULT_as_0 : bit;
signal port_RESULT_mux_0 : bit;
signal port_RESULT_bef_0 : bit;

signal port_RESULT_1 : signed( 31 downto 0 );
signal port_RESULT_ev_1 : bit;
signal port_RESULT_as_1 : bit;
signal port_RESULT_mux_1 : bit;
signal port_RESULT_bef_1 : bit;

signal port_RESULT_old : signed( 31 downto 0 );
signal port_RESULT_new : signed( 31 downto 0 );
signal port_RESULT_bef : bit;

signal sig_timer_old : signed( 63 downto 0 );
signal sig_timer_new : signed( 63 downto 0 );
signal sig_timer_start : bit;
signal sig_timer_val : signed( 63 downto 0 );
signal sig_timer_stop : bit;
begin OnInstance0 : Test_ON0 port map(
timer_value_in => sig_timer_val,
start_timer => sig_timer_start_0,
stop_timer => sig_timer_stop_0,
timer_as => sig_timer_as_0,
timer_value_out => sig_timer_value_0,
port_A => port_A ,
port_B => port_B ,
port_C => port_C ,
port_D => port_D ,
port_RESET => port_RESET ,
port_RESULT => port_RESULT_0 ,
```

```
port_RESULT_ev  => port_RESULT_ev_0,
port_RESULT_as  => port_RESULT_as_0,
port_RESULT_old => port_RESULT_old );

OnInstance1 : Test_ON1 port map(
timer_value_in => sig_timer_val,
start_timer => sig_timer_start_1,
stop_timer => sig_timer_stop_1,
timer_as => sig_timer_as_1,
timer_value_out => sig_timer_value_1,
port_A => port_A ,
port_B => port_B ,
port_C => port_C ,
port_D => port_D ,
port_RESET => port_RESET ,
port_RESULT => port_RESULT_1 ,
port_RESULT_ev  => port_RESULT_ev_1,
port_RESULT_as  => port_RESULT_as_1,
port_RESULT_old => port_RESULT_old );

multiOr_1_in_0 : multiOr_1 port map(
input  => port_RESET_ev,
output => Class_0 );

multiOr_4_in_1 : multiOr_4 port map(
input( 0 ) => port_A_ev,
input( 1 ) => port_B_ev,
input( 2 ) => port_C_ev,
input( 3 ) => port_D_ev,
output     => Class_1 );

MUXPRIO_2_int_port_RESULT : MUXPRIO_2_int port map(
outVal => port_RESULT_new,
ValC0 => port_RESULT_0,
ValC1 => port_RESULT_1,
AsIn( 0 ) => port_RESULT_mux_0,
AsIn( 1 ) => port_RESULT_mux_1,
oldVal => port_RESULT_old );

FFD_int_port_RESULT : FFD_int port map(
 d => port_RESULT_new ,
 q => port_RESULT_old ,
 clk => clk );

port_RESULT <= port_RESULT_old;
```

```
    FFD_bit_port_RESULT_ev : FFD_bit port map(
 d => port_RESULT_bef ,
 q => port_RESULT_ev ,
 clk => clk );

And_port_RESULT_as_0 : AND2STD
port map(
 I0 => port_RESULT_as_0 ,
 I1 => Class_0 ,
 O => port_RESULT_mux_0 );

And_port_RESULT_ev_0 : AND2STD
port map(
 I0 => port_RESULT_ev_0 ,
 I1 => Class_0 ,
 O => port_RESULT_bef_0 );

And_port_RESULT_as_1 : AND2STD
port map(
 I0 => port_RESULT_as_1 ,
 I1 => Class_1 ,
 O => port_RESULT_mux_1 );

And_port_RESULT_ev_1 : AND2STD
port map(
 I0 => port_RESULT_ev_1 ,
 I1 => Class_1 ,
 O => port_RESULT_bef_1 );

multiOr_2_out_port_RESULT : multiOr_2 port map(
input( 0 ) => port_RESULT_bef_0,
input( 1 ) => port_RESULT_bef_1,
output => port_RESULT_bef );

end structurelle;

-- PART - G
    architecture schematique of main is
  signal Signal_0 : boolean;
  signal Signal_0_ev : bit;
  signal Signal_1 : boolean;
  signal Signal_1_ev : bit;
  signal Signal_2 : boolean;
  signal Signal_2_ev : bit;
  signal Signal_3 : boolean;
  signal Signal_3_ev : bit;
  signal Signal_4 : boolean;
```

```
signal Signal_4_ev : bit;
signal Signal_5 : signed( 31 downto 0 );
signal Signal_5_ev : bit;

begin
P1 : Test port map(
port_A => Signal_0,
port_A_ev => Signal_0_ev,
port_B => Signal_1,
port_B_ev => Signal_1_ev,
port_C => Signal_2,
port_C_ev => Signal_2_ev,
port_D => Signal_3,
port_D_ev => Signal_3_ev,
port_RESET => Signal_4,
port_RESET_ev => Signal_4_ev,
port_RESULT => Signal_5,
port_RESULT_ev => Signal_5_ev,
start => start,
clk => clk );

Signal_0 <= toTopBool( port_A );
Signal_0_ev <= port_A_ev;
port_RESULT <= toTopBv( Signal_5 );
port_RESULT_ev <= Signal_5_ev;
Signal_1 <= toTopBool( port_B );
Signal_1_ev <= port_B_ev;
Signal_2 <= toTopBool( port_C );
Signal_2_ev <= port_C_ev;
Signal_3 <= toTopBool( port_D );
Signal_3_ev <= port_D_ev;
Signal_4 <= toTopBool( port_RESET );
Signal_4_ev <= port_RESET_ev;

end schematique;
```

The parts of VHDL program code that are contained in boxes are translated from K3 source code, whereas everything else is automatically generated. These parts correspond to internal components and to the K3 main schematic.

Special libraries (ctype, conversion, RodinStd) are used in the VHDL code. These are located in the "VHDL use files" directory on the program code listing appendix.

As for the generated C code, VHDL code is separated into seven parts as follow. This code corresponds to the preferred embodiment of the present invention.

Part A contains the usual library used and, in form of a package, all the components used in the main VHDL schematic. There is a main component, a Test component and all components inside the Test component. The Test component corresponds to FIG. 10.

Part B contains the entity of the main component, generated at step 77.

Part C contains the entity of the Test component, generated at step 77.

Part D contains the entities and the architectures of the two "ON" functions of the K3 program, 87a and 87b, generated at step 79.

Part E contains the entities and the architectures of all standard components, i.e. all components of FIG. 10, except 87a and 87b, generated at step 80.

Part F is the code of the schematic for the Test component, see FIG. 10. It includes signal declarations, instances for the components of part D and E and port maps, generated at step 81.

Finally, part G is the code of the main schematic. It includes the signal declarations, instances of all components in the main component and the port maps, generated at step 82.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. A method of executing machine program code using an essentially sequential, non-parallel computer processor to provide a faithful facsimile of hardware signal or data processing having parallel processing capability, said code defining a plurality of components, each one of said components performing at least one signal or data operation, each one of said components receiving at least one signal or data value input and providing at least one signal or data value output, the method comprising:
  a) defining processing steps, wherein each one of said operations may only be performed once during each of said processing steps;
  b) defining an associated event value for some of said outputs;
  c) defining for each one of said components having event values associated with a plurality of signal or data value inputs, an indication of priority associated with each one of said inputs;
  d) setting said event value when said associated output signal or data value changes in a current one of said processing steps, and resetting said event value when said associated output signal or data value does not change in said current one of said processing steps, said event value being set or reset at an end of said current one of said processing steps;
  e) selectively performing said operations during each of said processing steps when at least one of said event values is set for said input signals or data values specific to said operations, wherein said operations are performed in accordance with said priority; and
  f) buffering said signal or data value outputs so as to prevent changes to them from being read by said inputs within a same one of said processing steps, and copying said buffered outputs at an end of each one of said processing steps so as to allow them to be read by said inputs in a next one of said processing steps.

2. The method as claimed in claim 1, wherein said code is processed by a code generator to automatically provide executable code, including virtual machine code, performing said steps (a) through (f).

3. The method as claimed in claim 1, wherein said code is processed by a code interpreting virtual machine to performing said steps (a) through (f).

4. The method as claimed in claim 1, wherein said code is also converted into hardware programming data for providing hardware operation according to said code.

5. The method as claimed in claim 1, wherein said indication of priority includes a priority value indicating that an input data value, for which said associated event value was set, is not to be used.

6. The method as claimed in claim 1, wherein said performing operations in accordance with said priority comprises executing lowest priority operations first and highest priority operations last.

7. The method as claimed in claim 4, wherein said hardware programming data is VHDL and is used for programming an FPGA device.

8. The method as claimed in claimed 4, wherein said processing steps are executed synchronously with respect to a clock.

9. The method as claimed in claim 1, wherein said sequential non-parallel computer processor is one of a plurality of processors collaborating to execute said machine program code.

10. The method as claimed in claim 1, wherein said executing machine program code on said sequential processor is performed in real-time.

11. The method as claimed in claim 1, wherein said event values are automatically associated with all signal or data value outputs and wherein there exists a priority level associated with said inputs, indicating to ignore some of said events associated with said inputs.

12. The method as claimed in claim 1, wherein said defining an associated event value for some of said outputs includes defining an output to be one of an active port, for which said event value triggers the execution of a function and a passive port, for which said event value is not associated to a function.

13. A method of multi-platform machine programming, the method comprising:
  specifying a machine definition code defining a plurality of signal or data processing components, each said component performing at least one signal or data operation, and a communication of data or signals between said components;
  automatically converting said code into computer instructions for execution on an essentially sequential, non-parallel computer processor, an execution of said instructions on said sequential processor comprising:

a) defining processing steps, wherein each one of said operations may only be performed once during each of said processing steps;
b) defining an associated event value for some of said outputs;
c) defining for each one of said operations having event values associated with a plurality of signal or value inputs, an indication of priority associated with each one of said inputs;
d) setting said event value when said associated input or output signal or data value changes in a current one of said processing steps, and resetting said event value when said associated input or output signal or data value does not change in said current one of said processing steps, said event value being set or reset at an end of said current one of said processing steps;
e) selectively performing said operations during each of said processing steps when at least one of said event values is set for said input signals or data values specific to said operations, wherein said operations are performed in accordance with said priority; and
f) buffering said signal or data value outputs so as to prevent changes to them from being read by said inputs within a same one of said processing steps, and copying said buffered outputs at an end of each one of said processing steps so as to allow them to be read by said inputs in a next one of said processing steps;

automatically converting said code into hardware programming data for providing real-time hardware operation according to said code, said converting comprising:

including, in said hardware programming data, event control circuitry specification, priority control circuitry specification and buffering control circuitry specification to ensure that said hardware operation matches said execution on said sequential computer processor;

said machine code being implemented using said hardware programming data on a hardware machine having parallel processing capability and using said computer instructions on said sequential processor in a manner that is essentially exchangeable.

14. The method as claimed in claim 13, further comprising information defining whether said inputs and said outputs are to be associated with said event values, wherein not all said inputs and said outputs are associated with said event values.

15. The method as claimed in claim 13, wherein said indication of priority includes a priority value indicating that an input data value, for which said associated event value was set, is not to be used.

16. The method as claimed in claim 13, wherein said hardware programming data is a HDL, and is used for programming an FPGA device.

17. The method as claimed in claim 13, wherein said event values are automatically associated with all signal or data value outputs and wherein there exists a priority level associated with said inputs, indicating to ignore some of said events associated with said inputs.

18. The method as claimed in claim 13, wherein said defining an associated event value for some of said outputs includes defining an output to be one of an active port, for which said event value triggers the execution of a function and a passive port, for which said event value is not associated to a function.

19. The method as claimed in claim 13, wherein said sequential non-parallel computer processor is one of a plurality of processors collaborating to execute said machine program code.

20. The method as claimed in claim 13, wherein said executing machine program code on said sequential processor is performed in real-time.

* * * * *